(12) United States Patent
Matsumoto

(10) Patent No.: US 8,261,438 B2
(45) Date of Patent: Sep. 11, 2012

(54) METHOD FOR FORMING METAL PATTERN, METAL PATTERN AND PRINTED WIRING BOARD

(75) Inventor: Kazuhiko Matsumoto, Minami-Ashigara (JP)

(73) Assignee: FUJIFILM Corporation, Tokyo (JP)

( * ) Notice: Subject to any disclaimer, the term of this patent is extended or adjusted under 35 U.S.C. 154(b) by 998 days.

(21) Appl. No.: 12/297,292

(22) PCT Filed: Apr. 10, 2007

(86) PCT No.: PCT/JP2007/057884
§ 371 (c)(1), (2), (4) Date: Oct. 15, 2008

(87) PCT Pub. No.: WO2007/123022
PCT Pub. Date: Nov. 1, 2007

(65) Prior Publication Data
US 2009/0277672 A1    Nov. 12, 2009

(30) Foreign Application Priority Data
Apr. 18, 2006 (JP) ................. 2006-114849

(51) Int. Cl.
H05K 3/02 (2006.01)
H05K 3/10 (2006.01)

(52) U.S. Cl. .......................... 29/847; 29/846
(58) Field of Classification Search .................. 29/847, 29/846, 825, 852; 427/96.1; 205/167, 123, 205/125
See application file for complete search history.

(56) References Cited

U.S. PATENT DOCUMENTS

| | | | |
|---|---|---|---|
| 3,188,165 A * | 6/1965 | Magat et al. ................. 8/115.52 |
| 3,745,042 A * | 7/1973 | Lim et al. ....................... 427/164 |
| 3,892,575 A * | 7/1975 | Watts et al. .................... 430/532 |
| 4,275,092 A * | 6/1981 | Nakayama et al. ........... 427/511 |
| 4,355,053 A * | 10/1982 | Nezu et al. .................... 427/516 |
| 5,648,201 A * | 7/1997 | Dulcey et al. ................. 430/324 |
| 5,889,073 A * | 3/1999 | Zhang et al. ....................... 522/3 |
| 6,306,492 B1 * | 10/2001 | Yamada et al. ............ 428/317.7 |
| 6,566,029 B2 * | 5/2003 | Kawamura et al. ........... 430/138 |
| 6,593,059 B2 * | 7/2003 | Kawamura et al. ........ 430/270.1 |
| 6,607,866 B1 * | 8/2003 | Kawamura et al. ........ 430/270.1 |
| 7,288,287 B2 * | 10/2007 | Tanaka et al. .................. 427/304 |
| 7,306,895 B2 * | 12/2007 | Kano et al. ..................... 430/291 |
| 7,849,593 B2 * | 12/2010 | Kawamura et al. ............. 29/846 |
| 2002/0102745 A1 * | 8/2002 | Lahiri et al. ....................... 438/4 |
| 2002/0106583 A1 * | 8/2002 | Kawamura et al. .......... 430/271.1 |
| 2003/0068581 A1 * | 4/2003 | Kawamura et al. ........... 430/315 |
| 2003/0186162 A1 * | 10/2003 | Takahashi et al. .......... 430/270.1 |
| 2004/0067434 A1 * | 4/2004 | Kano et al. ................. 430/270.1 |
| 2004/0112634 A1 * | 6/2004 | Tanaka et al. .................. 174/262 |
| 2004/0209203 A1 * | 10/2004 | Kano et al. ..................... 430/324 |
| 2005/0175824 A1 * | 8/2005 | Wakizawa et al. ............. 428/209 |
| 2008/0029294 A1 * | 2/2008 | Kawamura et al. ........... 174/261 |

FOREIGN PATENT DOCUMENTS

| | | | |
|---|---|---|---|
| JP | 58-196238 A | | 11/1983 |
| JP | 58196238 | * | 11/1983 |
| JP | 2005-037881 A | | 2/2005 |
| JP | WO2005120142 | * | 12/2005 |
| JP | 2006-057059 A | | 3/2006 |
| JP | 2006057059 | * | 3/2006 |
| WO | 2005/120142 A1 | | 12/2005 |

OTHER PUBLICATIONS

Kang et al, Surface Modification of Fluoropolymers via Molecular Design, Oct. 16, 2000, Adv. Mater., No. 20, 1481-1494.*
Kang et al., "Surface Modification of Fluoropolymers via Molecular Design," Advanced Materials, vol. 12, No. 12, Oct. 16, 2000, pp. 1481-1494.
"Leading-edge Trend of Micro Junction/wiring Technology," published by Toray Research Center, Inc., Nov. 2003, pp. 314-315 with translation from pp. 314-315, 7 pages English and Japanese.

* cited by examiner

Primary Examiner — David Angwin
(74) Attorney, Agent, or Firm — Sughrue Mion, PLLC

(57) ABSTRACT

The present invention provides a method for forming a metal pattern comprising a step of forming a polymer layer on a substrate; (a2) a step of applying a metal ion or the like to the polymer layer; (a3) a step of forming a conductive layer by reducing the metal ion or the like; (a4) a step of forming a patterned resist layer on the conductive layer; (a5) a step of forming a metal pattern by electroplating in the regions where the resist layer is not formed; (a6) a step of separating the resist layer; (a7) a step of removing the conductive layer from regions protected by the resist layer; and (a8) a step of performing a hydrophobilizing treatment.

9 Claims, No Drawings

METHOD FOR FORMING METAL PATTERN, METAL PATTERN AND PRINTED WIRING BOARD

TECHNICAL FIELD

The present invention relates to a method for forming a metal pattern and a metal pattern. In particular, the invention relates to a method for forming a metal pattern and a metal pattern that are useful as a metal thin film for wiring in electronic materials such as printed wiring boards and digital image display devices.

BACKGROUND ART

Metal films formed on a substrate are used in various electric appliances by being pattern-formed.

For conventional methods for forming a metal pattern, mainly a "subtractive method," a "semi-additive method" and a "full-additive method" are known.

A subtractive method is a method of: providing a photosensitive layer, which is photosensitive to irradiation with actinic radiation, on a metal layer formed on a substrate; carrying out image-wise light-exposure and developing to form a resist image; then etching the metal layer to form a metal pattern; and finally separating the resist therefrom.

In substrates used with this technique, in order to provide adhesiveness between the substrate and the metal layer, roughening treatment is carried out to the substrate interface, and adhesiveness is generated due to an anchoring effect. As a result, the substrate interface portion of the completed metal film is irregular, and so the high frequency characteristics thereof deteriorate when the metal film is used for electrical wiring lines. Furthermore, when forming such a metal substrate, a complicated process of treating the substrate with a strong acid, such as chromic acid, is required in order to carry out roughening treatment of the substrate.

In order to address these issues, a method is proposed for minimizing the irregularities (roughness) of the substrate and for simplifying the treatment process of the substrate. This method involves performing surface modification by grafting a radical polymerizable compound to the substrate surface (see, for example, Patent Document 1, and Non-patent Document 1). However, expensive equipment (such as a γ-ray generator or an electron beam generator) is required for this method. Moreover, since the substrate used by this method is not one to which polymerization initiation groups used as the starting point of graft polymerization are introduced, the graft polymer may not be generated at a sufficient level in practice. Furthermore, even if the metal substrate produced by this technique is patterned using a subtractive process, there are inherent problems with the subtractive method.

That is, in order to form a metal pattern with extremely thin line widths using a subtractive method, an over etching method is effective in which the line width after etching becomes narrower than the line width of the resist pattern itself. However, when attempting to form a fine metal pattern directly by such an over etching method, line smudging, thin spots/cracks, discontinuities and the like readily occur, therefore it is difficult to form metal patterns of 30 μm or less from the viewpoint of forming favorable fine metal patterns. Moreover, wasteful etching processes are required to remove metal thin film from areas other than the pattern portions, and environmental and cost issues arise, such as the expense incurred for treatment of the metal waste fluid produced by such etching processes.

In order to address the above issues, a metal pattern forming technique called a semi-additive method is proposed. With a semi-additive method, a base substrate layer of Cr or the like is thinly formed by metal plating or the like on a substrate, and a resist pattern is formed on the substrate metal layer. Then, after forming a metal layer of Cu or the like by metal plating on the base substrate metal layer in regions other than those of the resist pattern, a wiring pattern is formed by removing the resist pattern. Thereafter, the base substrate metal layer is etched using the wiring pattern as a mask, and a metal pattern is formed in regions other than those of the resist pattern. Since this is an etching-less technique, a fine wiring pattern of 30 μm or less is readily formed, and this technique is effective from the environmental and cost perspectives since metal is only deposited by metal plating in the required portions. However, in order to provide adhesiveness between the substrate and the metal pattern with this technique, roughening treatment of the substrate surface needs to be performed, and as a result the substrate interface portion of the completed metal pattern is irregular, and the high frequency characteristics deteriorate when applied to electrical wiring.

Moreover, a fully-additive process is proposed as a metal pattern forming technique. In a fully-additive process, a resist pattern is formed on a substrate, metal is deposited on regions other than those of the resist pattern by metal plating, and the resist pattern is then removed. Since this technique is also an etching-less technique, a fine wiring pattern of 30 μm or less is readily formed, but there are the same issues as with semi-additive processes.

Accordingly, a new metal pattern forming technique is desired which is capable of forming a fine wiring pattern, has few irregularities of the substrate interface, and produces little etching waste liquid.

Moreover, a fully-additive process is proposed as a metal pattern forming technique. In a fully-additive process, a resist pattern is formed on a substrate, metal is deposited on regions other than those of the resist pattern by metal plating, and the resist pattern is then removed. Since this technique is also an etching-less technique, a fine wiring pattern of 30 μm or less is readily formed, but there are the same issues as with semi-additive processes. Accordingly, a new metal pattern forming technique is desired which is capable of forming a fine wiring pattern, has few irregularities of the substrate interface, and produces little etching waste liquid.

Moreover, increasing the smoothness of an electric conductor surface contributes greatly to increasing density. Surface roughening is performed in conventional build-up printed circuit boards, in order to secure peel strength, but the reality is that such irregularities, of the order of several microns, have become a hindrance to further micronization of wiring lines. In particular, there is a problem of impairing suitability for high frequency transmission in semiconductor devices, with a wiring board using a substrate to which surface roughening has been carried out.

Therefore, a method is desired for forming a fine and dense metal pattern with high adhesiveness on a smooth insulating substrate, for the formation of printed wiring boards applicable to semiconductor devices.

Further, for fine wirings in printed wiring boards and the like, a high insulating property between wirings (electroconductive layers) is also desired.

Patent Document 1: Japanese Patent Application Laid-Open (JP-A) No. 58-196238

Non-patent Document 1: "Advanced Materials," vol. 20, p. 1481-1494, 2000

Non-patent Document 2: "Leading-edge Trend of Micro Junction/wiring Technology" p. 314, published by TORAY RESEARCH CENTER, Inc., November 2003

DISCLOSURE OF THE INVENTION

Problems to be Solved by the Invention

Accordingly, there are needs for a method of forming a metal pattern which enables formation of a fine metal pattern without performing an etching process, and enables formation of a metal pattern having high adherence to a substrate, minor irregularities at the interface with the substrate, and sufficient electric conductivity and, at the same time, a high insulation property in regions at which the metal pattern is not present; and also for a metal pattern obtained by such a method for forming a metal pattern. Further, there are needs for a printed wiring substrate that is provided with an electroconductive layer having high adherence with a substrate and that is both fine and has high density and that has, at the same time, excellent insulating property between the electroconductive layers.

Means for Solving the Problems

The present inventor accomplished the present invention in view of the aforementioned circumstances.

A first aspect of the invention is to provide a method for forming a metal pattern including the steps of:

(a1) a step of providing, on a substrate, a polymer layer that comprises a polymer containing a functional group that interacts with a metal ion or a metal salt, the polymer directly chemically bonding to the substrate;

(a2) a step of applying a metal ion or a metal salt to the polymer layer;

(a3) a step of reducing the metal ion or the metal salt to form a conductive layer having a surface resistivity of from 5 Ω/square to 100 kΩ/square;

(a4) a step of forming a pattern-shaped resist layer on the conductive layer having a surface resistivity of from 5 Ω/square to 100 kΩ/square;

(a5) a step of forming, in a region where the resist layer is not formed, a metal pattern by electroplating;

(a6) a step of separating the resist layer;

(a7) a step of removing the conductive layer formed in the step (a3) from a region that has been protected by the resist layer; and (a8) a step of performing a hydrophobilizing treatment at the polymer layer that has been provided in the step (a1) and that is present in the region from which the conductive layer has been removed in the step (a7).

In the following description, the method for forming a metal pattern according to the first aspect may sometimes be referred to as "metal pattern forming method (1)."

A second aspect of the invention is to provide a method for forming a metal pattern including the steps of:

(b1) a step of providing, on a substrate, a polymer layer that comprises a polymer containing a functional group that interacts with a metal colloid, the polymer directly chemically bonding to the substrate;

(b2) a step of applying a metal colloid to the polymer layer to form a conductive layer having a surface resistivity of from 5 Ω/square to 100 kΩ/square;

(b3) a step of forming a pattern-shaped resist layer on the conductive layer having a surface resistivity of from 5 Ω/square to 100 kΩ/square;

(b4) a step of forming, in a region where the resist layer is not formed, a metal pattern by electroplating;

(b5) a step of separating the resist layer;

(b6) a step of removing the conductive layer formed in the step (b2) from a region that has been protected by the resist layer; and (b7) a step of performing a hydrophobilizing treatment at the polymer layer that has been provided in the step (b1) and is present in the region from which the conductive layer has been removed in the step (b6).

In the following description, the method for forming a metal pattern of the second aspect may sometimes be referred to as "metal pattern forming method (2)."

A third aspect of the invention provides a metal pattern obtained by the method for forming a metal pattern of the aspect 1 or 2 of the invention.

A fourth aspect of the invention provides a printed wiring board provided with the metal pattern of the third aspect of the invention as an electroconductive layer.

A "substrate" in the present invention refers to something with a surface to which a polymer is able to directly chemically bond. For example, when chemically bonding a polymer directly to a resin film, the term "substrate" refers to the resin film itself, and when an intermediate layer, such as a polymerization initiation layer, is provided on a surface of a base material such as a resin film, and a polymer is chemically bonded directly to this surface, then the term "substrate" refers to the film base material and the polymerization initiation layer provided therewith.

In the following, a functional group that interacts with a metal ion, a metal salt, or a metal colloid may be referred to as an "interactive group", for convenience.

The metal pattern obtained with the metal pattern forming method of the present invention, is preferably a metal pattern that is provided on a substrate having surface irregularities of no more than 500 nm, and the adhesiveness of such a metal pattern to such a substrate is preferably 0.2 kN/m or more.

By using a substrate with surface irregularities no more than 500 nm, the surface irregularities of a polymer layer formed thereon also becomes no more than 500 nm. By performing electroplating after applying a metal ion or a metal salt to such a polymer layer and reducing it, or after applying a metal colloid thereto, a state is achieved where the metal used in the metal plating penetrates into the polymer layer (a composite state), and further the metal plating film is formed on the polymer layer. Consequently, the roughness of the interface of the thus formed metal pattern and the substrate (the interface of the metal with the polymer layer (organic component)) becomes slightly rougher due to the plating metal penetrated into the polymer pattern, in comparison to the roughness of the surface of the polymer pattern. However, since this increase in roughness is only by a minor amount, the irregularities at the interface of the metal plating layer (inorganic component) with the polymer layer (organic component) of a metal pattern may be suppressed to the extent that the high frequency characteristics of the metal pattern do not deteriorate. Therefore, when using such a metal pattern for electrical wiring, superior high frequency characteristics may be obtained. High frequency characteristics are characteristics of reduction in transmission loss during high frequency power transmission, and in particular, characteristics of reduction in conductor loss.

After detailed investigations into the polymer layer (organic component) which is present between such a metal pattern and a substrate, the polymer layer which is present between the metal pattern and the substrate is found to have a portion, containing particles of a metal which has been deposited by electroplating at 25% by volume or more thereof, to a thickness of 0.05 μm or more in a direction from the interface of the substrate and the metal pattern, and it is thought that the presence of these particles of metal or the like provides a composite state that is beneficial to the adhesiveness of the metal pattern.

Here, by reducing the irregularities of the substrate surface, the roughness of the substrate interface portion with the metal pattern may be further suppressed, and the high frequency characteristics of the obtained metal pattern may be improved. In view of this, a substrate with surface irregularities of 100 nm or less is preferably used.

In addition, the substrate surface of the metal pattern portion obtained by the invention has the substrate interface with a minimized surface irregularity by modifying the surface through surface grafting, and that the substrate interface of metal portion is in a hybrid state with the graft polymer that is directly connected to the substrate. Thereby, it is considered that adhesiveness between the formed metal film and the substrate is high.

In the present invention, Rz according to JIS B0601 is used as the standard for surface roughness, namely "the difference between the average of the Z data from the maximum peak to the fifth highest peak, and the average of the Z data from the minimum valley to the fifth lowest valley".

When the metal pattern obtained with the application of the present invention is used as a conductive material, such as in a wiring board, the less the irregularities at the interface of the formed metal pattern, i.e., the interface of wiring metal portions with the organic material are, the less the power loss during high frequency power transmission (transmission loss) becomes.

Further, the method for forming a metal pattern of the invention is characterized by performing, after the formation of the metal pattern, a hydrophobilizing treatment at the polymer layer exposed in a region in which no metal pattern is present. As the result of such hydrophobilizing treatment, the metal pattern obtained by the invention has an improved insulating property in the region where no metal pattern is present. Therefore, when the metal pattern is applied to wiring in various electronic materials, wirings having high reliability without the occurrence of short circuit, in despite of fine wirings, can be obtained.

As described above, when the metal pattern obtained by applying the invention is used as wiring portions in printed wiring boards and the like, a fine and dense wiring having an excellent planarity and close adherence with the substrate is formed, to result in, at the same time, one that has a sufficient electric conductivity, excellent insulating property between wirings, and also excellent high frequency characteristics.

Effects of the Invention

The present invention can provide a method of forming a metal pattern which enables formation of a metal pattern having high adherence to a substrate, minor irregularities at the interface with the substrate, and sufficient electric conductivity and, at the same time, a high insulation property in regions at which the metal pattern is not present; and also for a metal pattern obtained by such a method for forming a metal pattern. Further, the present invention can provide a printed wiring substrate that is provided with an electroconductive layer having high adherence with a substrate and that is both fine and has high density and that has, at the same time, excellent insulating property between the electroconductive layers.

BEST MODE FOR CARRYING OUT THE INVENTION

Hereinafter, the metal pattern forming methods (1) and (2) will be described in detail.

Metal Pattern Forming Method (1)

The metal pattern forming method (1) includes the steps of:

(a1) a step of providing, on a substrate, a polymer layer that comprises a polymer containing a functional group that interacts with a metal ion or a metal salt, the polymer directly chemically bonding to the substrate;

(a2) a step of applying a metal ion or a metal salt to the polymer layer;

(a3) a step of reducing the metal ion or the metal salt to form a conductive layer having a surface resistivity of from 5 Ω/square to 100 kΩ/square;

(a4) a step of forming a pattern-shaped resist layer on the conductive layer having a surface resistivity of from 5 Ω/square to 100 kΩ/square (a5) a step of forming, in a region where the resist layer is not formed, a metal pattern by electroplating;

(a6) a step of separating the resist layer;

(a7) a step of removing the conductive layer formed in the step (a3) from the region that has been protected by the resist layer; and (a8) a step of performing a hydrophobilizing treatment to the polymer layer that has been provided in the step (a1) and exists in the region from which the conductive layer has been removed in the step (a7).

Hereinafter, each step in the metal pattern forming method (1) will be described in detail.

Step (a1)

In the step (a1), a polymer layer is provided on a substrate, the polymer layer including a polymer containing a functional group (an interactive group) that interacts with a metal ion or a metal salt, and directly chemically bonding to the substrate.

The step (a1) preferably includes: a step (a1-1) of preparing a substrate having a polymerization initiation layer containing a polymerization initiator formed on a base material; and a step (a1-2) of providing, on the polymerization initiation layer that has been formed on the substrate, a polymer layer including a polymer containing an interactive group, and is directly chemically bonding to the base material.

In the step (a1-2), it is preferable that the polymer is directly chemically bonded to the entire surface of the substrate by contacting a polymer containing a polymerizable group and an interactive group with the polymerization initiation layer formed on the substrate, and then applying energy thereto.

(Surface Graft)

Formation of the polymer layer on the substrate is performed by a general technique called surface graft polymerization. The graft polymerization method includes applying an active species to a polymer compound chain, and further polymerizing another monomer thereto that initiates polymerization with the active species, thereby synthesizing a graft polymer. Specifically, this polymerization is called surface graft polymerization, when the polymer compound to which the active species is applied forms a surface of a solid body.

Any known methods described in publications can be applied as the surface graft polymerization method of the present invention. For example, a photo-graft polymerization method and a plasma irradiation graft polymerization method are described as surface graft polymerization methods at page 135 of Shin Kobunshi Jikken-gaku (New Polymer Experimentology) 10, edited by the Society of Polymer Science, Japan, published in 1994 by Kyoritsu Shuppan Co., Ltd. There are also radiation irradiation graft polymerization methods, such as using γ-rays or an electron beam, described at pages 203 and 695 of Kyuchaku Gijutsu Binran (Handbook of Adsorption Technology), under the editorial supervision of Takeuchi, published by NTS, Inc., February 1999. Specific methods of photo-graft polymerization which may be used include the methods described in JP-A No. 63-92658, JP-A No. 10-296895, and JP-A No. 11-119413.

As techniques for producing a polymer layer directly chemically bonding at the terminals of the polymer compound chains, in addition to the above methods, a method can also be applied in which reactive functional groups, such as a trialkoxysilyl group, an isocyanate group, an amino group, a hydroxyl group, or a carboxyl group, are provided to a terminal end of a polymer compound chain, and a coupling reaction of these groups and functional groups present on the substrate surface to form a polymer layer. A photo-graft polymerization method is preferable from the standpoint of generating more surface graft polymers.

Substrate

The substrate of the present invention has a surface having a functionality such that a terminal end of a polymer compound containing an interactive group is able to directly, or via a trunk polymer compound, chemically bond thereto. A base material itself may have such a surface property, or a separate intermediate layer may be provided on such a base material, or the intermediate layer may have such characteristics As a technique for producing a surface to which the terminal end of a chain of a polymer compound containing an interactive group is chemically bonded via a trunk polymer compound, there is a method including synthesizing a polymer compound containing an interactive group and a functional group capable of carrying out a coupling reaction with a functional group at the substrate surface, and forming the surface by the coupling reaction of this polymer compound and the functional group at the substrate surface. There is another method including, when the substrate surface has a property of generating a radical species, synthesizing a polymer compound containing a polymerizable group and an interactive group, applying this polymer compound onto the substrate interface, generating the radical species, and causing a polymerization reaction of the substrate surface with the polymer compound to form the surface.

In the present invention, an active species is applied to a substrate surface as described above, and a graft polymer is generated starting from the active species. When generating the graft polymer, it is preferable to form a polymerization initiation layer containing a polymerization initiator on the substrate (step (a-1)), from a standpoint of efficiently generating active sites to generate more surface graft polymers.

The polymerization initiation layer is preferably formed as a layer containing a polymerizable compound and a polymerization initiator.

The polymerization initiation layer of the present invention may be formed by dissolving the essential components in a solvent in which they are soluble, disposing the solution on a substrate surface by a method such as coating, and curing the film by heating or light-irradiation thereon.

(a) Polymerizable Compound

There are no particular limitations to the polymerizable compound used for the polymerization initiation layer, as long as it has good adhesiveness to a base material, and as long as a surface graft polymer is generated by the application of energy thereto, such as by actinic radiation irradiation. Polyfunctional monomers and the like may be used, but a particularly preferable embodiment is one using a hydrophobic polymer containing a polymerizable group within its molecule.

Specific examples of such a hydrophobic polymer include: diene-containing homopolymers, such as polybutadiene, polyisoprene, and polypentadiene, and allyl group-containing homopolymers, such as allyl(meth)acrylate, and 2-allyloxyethyl methacrylate; binary or multicomponent copolymers which include as a structural unit a diene-containing monomer, such as butadiene, isoprene, pentadiene, and the like, or an allyl group-containing monomer, such as styrene, (meth)acrylate, and (meth)acrylonitrile; and linear or three-dimensional copolymers that have a carbon-carbon double bond within their molecules, such as an unsaturated polyester, an unsaturated polyepoxide, an unsaturated polyamide, an unsaturated polyacrylate, a high density polyethylene, and the like It should be noted that in this specification when referring to "acrylic and/or methacrylic", this is sometimes written as "(meth)acrylic".

The amount contained of the polymerizable compound in the polymerization initiation layer is preferably in the range of from 0 mass % to 100 mass % in terms of solid content, and the range from 10 mass % to 80 mass % is particularly preferable.

(b) Polymerization Initiator

A polymerization initiator for exhibiting a polymerization initiation ability with energy application is included in the polymerization initiation layer. Such a polymerization initiator may be suitably selected according to the application from known thermal polymerization initiators, photo polymerization initiators and the like which exhibit a polymerization initiation ability with application of certain energy thereto, for example, irradiation of actinic radiation, heating, irradiation of an electron beam, and the like. A photopolymerization initiator is preferably employed, from among these, since photopolymerization is preferable from the standpoint of manufacturability.

There is no particular limitation to the photopolymerization initiator, as long as it is active in the irradiated actinic radiation and is capable of surface graft polymerization. For example, a radical polymerization initiator, an anionic polymerization initiator, a cationic polymerization initiator, and the like, may be used. Among these, a radical polymerization initiator is preferable from the standpoint of reactivity.

Specific examples of such a photopolymerization initiator include, for example: acetophenones such as p-tert-butyl-trichloroacetophenone, 2,2'-diethoxyacetophenone, and 2-hydroxy-2-methyl-1-phenyl propan-1-one; ketones such as benzophenone (4,4'-bisdimethylaminobenzophenone), 2-chlorothioxantone, 2-methylthioxantone, 2-ethylthioxantone, and 2-isopropylthioxantone; benzoin ethers, such as benzoin, benzoin methyl ether, benzoin isopropyl ether, and benzoin isobutyl ether; benzyl ketals such as benzyl dimethyl ketal, and hydroxycyclohexyl phenyl ketone; and the like The amount contained of the polymerization initiator in the polymerization initiation layer is preferably in the range of from 0.1 mass % to 70 mass % in terms of solid content, and the range from 1 mass % to 40 mass % is particularly preferable.

There is no particular limitation to the solvent used for coating a polymerizable compound and a polymerization initiator, as long as it dissolves these components therein. A solvent whose boiling point is not too high is preferable from the standpoints of ease of drying and workability, and specifically a solvent with a boiling point of from about 40° C. to about 150° C. may be selected.

Specific examples of the solvent include acetone, methyl ethyl ketone, cyclohexane, ethyl acetate, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, methanol, ethanol, 1-methoxy-2-propanol, 3-methoxypropanol, diethylene glycol monomethyl ether, diethylene glycol monoethyl ether, diethylene glycol dimethyl ether, diethylene glycol diethylether, propylene glycol monomethyl ether acetate, propylene glycol monoethyl ether acetate, 3-methoxypropyl acetate, and the like.

These solvents may be used singly or as mixtures thereof. A solid concentration of from 2 to 50 mass % is suitable for the coating liquid.

The coating amount when forming a polymerization initiation layer on a substrate is preferably from 0.1 g/m$^2$ to 20 g/m$^2$ dry weight, and more preferably from 1 g/m$^2$ to 15 g/m$^2$, from the standpoints of exhibiting sufficient polymerization initiation ability, maintaining a film property and preventing the film from peeling.

When forming a polymerization initiation layer in the present invention, as described above, the composition for the above polymerization initiation layer formation is disposed by coating or the like on the surface of a base material, and then the solvent is removed to form a film. When this is carried out, it is preferable to cure the film by performing heating and/or light-irradiation. It is particularly preferable to carry out a certain amount of curing of the polymerizable compound in advance, by pre-curing by light-irradiation after drying with heat, since the occurrences of the whole polymerization initiation layer falling off after grafting may be effectively suppressed thereby. The rational for using light-irradiation for pre-curing is similar to that described for the aforementioned photo-polymerization initiator.

Conditions of heating temperature and time may be selected so that there is sufficient drying of the coating liquid, however, a temperature of 100° C. or less for a time period of 30 minutes or less is preferable from the standpoint of applicability to production, with drying conditions of a drying temperature in the range of 40° C. to 80° C. and a drying time of 10 minute or less being more preferable.

After heating and drying, a light source used for the later described grafting reaction may be used for light-irradiation that is optionally performed. Preferably, the light-irradiation is performed to the extent that complete radical polymerization is not carried out, while the polymerizable compound present in the polymerization initiation layer is partially radical-polymerized, from the standpoint of not impeding formation of a bond between the active sites of the polymerization initiation layer and the graft chain that is carried out by applying energy during the subsequent grafting reaction. The light-irradiation duration depends on the strength of the light source, but it is generally preferably 30 minutes or less. As a rough guide to such pre-curing, the amount may be such that the residual film proportion after washing out the solvent is 10% or less, and the proportion of the initiator remaining after pre-curing is 1% or more.

Base Material

The base material used for the present invention is preferably a dimensionally stable plate-shaped member, and examples include, for example: paper, plastic (for example, polyethylene, polypropylene, polystyrene and the like) laminated paper, a metal plate (for example, aluminum, zinc, copper and the like), plastic films (for example, cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal, polyimide, epoxy and the like), paper, plastic films, and the like with a metal laminated, or vapor-deposited, thereon. A polyester film or a polyimide film is preferable as the base material used for the present invention.

The metal pattern obtained by the present invention can be applied to semiconductor packages, various electric wiring substrates and the like. When it is used for such applications, insulating resins as shown below are preferably used as the substrate.

Examples of such an insulating resin include resins such as polyphenylene ethers or modified polyphenylene ethers, cyanate ester compounds, and epoxy compounds. A substrate formed with a thermosetting resin composition containing one or more sorts of such resins is preferably used. When using such resins in combinations of two or more as a resin composition, preferable combinations include: polyphenylene ether or modified polyphenylene ether with a cyanate ester compound; polyphenylene ether or modified polyphenylene ether with an epoxy compound; and polyphenylene ether or modified polyphenylene ether with a cyanate ester compound and an epoxy compound.

When forming a substrate with such a thermosetting resin composition, inorganic fillers chosen from the group which includes silica, talc, aluminum hydroxide, and magnesium hydroxide are preferably not included therein, and a thermosetting resin composition which includes a bromine compound or a phosphorus compound is preferable.

Moreover, other insulating resins include 1,2-bis(vinylphenylene)ethane resin, or a modified resin of 1,2-bis(vinylphenylene)ethane resin with a polyphenylene ether resin. Such resins are described in detail, for example, in pages 1252 to 1258 of the 92nd volume of "Journal of Applied Polymer Science" (2004), by Satoru AMOU.

Furthermore, preferable examples include: commercially available liquid crystal polymers, with a representative example thereof being "VECSTAR" (trade name, made by Kuraray Co., Ltd.), and fluororesins and the like, with a representative example thereof being polytetrafluoroethylene (PTFE).

Among such resins, fluororesins (PTFE) have the most excellent high frequency characteristics of polymer materials. However, since they are thermoplastic resins with a low Tg, they have poor dimensional stability to heat, and the mechanical strength and the like thereof is inferior to those of thermosetting resin materials. Further, they also have inferior molding and processing characteristics. Moreover, thermoplastic resins, such as polyphenylene ether (PPE), may also be used after alloying with a thermosetting resin and the like. Examples that may be used include an alloyed resin of PPE with an epoxy resin or triarylisocyanate, or an alloyed resin of a PPE resin, into which a polymerizable functional group has been introduced, with another thermosetting resin.

Although dielectric characteristics of an epoxy resin are insufficient as they are, improvements have been achieved by introducing a bulky skeleton or the like. In this way, a resin is preferably used which takes advantage of the different characteristics from other resins to compensate for any deficiencies thereof, by introducing such a structure or by carrying out modification or the like. For example, although a cyanate ester is a thermosetting resin which has the most excellent dielectric characteristics among the thermosetting resins, it is rarely used on its own, and is more normally used as a modified resin, such as with an epoxy resin, a maleimide resin, or a thermoplastic resin. Details relating to such matters are described at page 35 of "Denshi Gijutsu" (Electronic Technology), No. 9, 2002, and one of these resins, or a similar insulating resin, may be chosen with reference thereto.

When applying the metal pattern obtained by the present invention to a semiconductor package, or to various electrical wiring applications and the like, it is effective to provide a low dielectric constant and a low dielectric tangent to the substrate, from the standpoint of carrying out mass data processing at high speed, and in order to suppress delay and attenuation of signals. Details regarding the materials having a low dielectric tangent are described at page 397 of "Electronics Jissou Gakkaishi" (Electronics Packaging Institution Journal), volume 7, No. 5, (2004). It is particularly preferable to adopt an insulating material having low dielectric tangent characteristics from a standpoint of improvements in speed.

Specifically, a substrate which includes an insulating resin whose dielectric constant (relative dielectric constant) at 1 GHz is 3.5 or less, or a substrate having a layer containing an insulating resin on a base material, is preferably used as the substrate for such applications. Moreover, it is preferable that the substrate is one formed from an insulating resin whose dielectric tangent at 1 GHz is 0.01 or less, or is a substrate which has a layer containing such an insulating resin on a base material.

The dielectric constant and the dielectric tangent of such insulating resins can be measured using a conventional method. For example, these characteristics can be measured according to the methods described at page 189 of "Collection of Extracts of the 18th Institute of Electronics Packaging Institution Convention", 2004, using a cavity resonator perturbation method (for example, an instrument for measuring $\varepsilon r$ and tan $\delta$ of a ultra-thin sheet, made by KEYCOM Corp.).

Thus, an insulating resin material may also be suitably selected for the present invention from standpoints of dielectric constant and dielectric tangent. Examples of insulating resins with a dielectric constant of 3.5 or less and a dielectric tangent of 0.01 or less include a liquid crystal polymer, a polyimide resin, a fluororesin, a polyphenylene ether resin, a cyanate ester resin, a bis(bisphenylene)ethane resin, modified resins thereof, and the like.

The irregularities on the surface of the base material applied to the metal pattern forming method of the present invention are preferably 500 nm or less, more preferably 200 nm or less, still more preferably 50 nm or less, and most preferably 20 nm or less.

Furthermore, the Rz (ten-point average roughness) of the surface of the base material is preferably 500 nm or less, more preferably 100 nm or less, still more preferably 50 nm or less, and most preferably 20 nm or less. It should be noted that the measuring method of Rz is the measurement undertaken according to JIS B0601 of "the difference between the average of the Z data from the maximum peak to the fifth highest peak, and the average of the Z data from the minimum valley to the fifth lowest valley".

Graft Polymer Generation

As generation modes of the graft polymer in the step (a1), as described above, a method of using a coupling reaction between a functional group present on the substrate surface and a reactive functional group at a terminal end or side chain of a polymer compound, and a method of carrying out direct photo-graft polymerization of the substrate may be used.

In the present invention, preferred is a mode (step (a1-2)) including introducing a polymer containing a functional group (an interactive group) which interacts with an electroless plating catalyst or a precursor thereof and that directly chemically bonds to the base material, onto the substrate on which the polymerization initiation layer has been formed. Further preferred is a mode in which, after contacting the polymer containing a polymerizable group and an interactive group with the base material on which the polymerization initiation layer has been formed, the polymer is directly chemically bonded to the entire substrate of the base material by applying energy thereto. That is to say, a composition containing the compound containing a polymerizable group and an interactive group is contacted with the polymerization initiation layer formed on the base material surface, and directly bonded to the base material surface by the active species generated on the base material surface.

The above contact may be performed by immersing a base material in a liquid-state composition including the compound containing a polymerizable group and an interactive group. However, as described later, a layer, containing a composition including a compound polymerizable group and an interactive group as a main component, may be formed on a substrate surface by an application method, from standpoints of handling and manufacturing efficiency.

<Method Using the Coupling Reaction Between a Functional Group Present on a Substrate Surface and a Reactive Functional Group at a Terminal End or Side Chain of a Polymer Compound>

In the present invention, any reactions may be applied as coupling reactions for generation of a graft polymer. Specific combinations of a functional groups on the substrate surface and a reactive functional group at a terminal end or side chain of the polymer compound include combinations of (—COOH, amine), (—COOH, aziridine) (—COOH, isocyanate), (—COOH, epoxy), (—NH$_2$, isocyanate), (—NH$_2$, aldehydes), (—OH, alcohol), (—OH, halogenated compound), (—OH, amine), and (—OH, acid anhydride). The combinations (—OH, polyvalent isocyanate) and (—OH, epoxy) are particularly preferable from a standpoint of high reactivity.

<Method of Direct Photo-Graft Polymerization to the Substrate>

(Monomers Having an Interactive Group and Capability of Photo-Graft Polymerization)

In the method of carrying out direct photo-graft polymerization to the substrate according to the present invention, the following monomers may be used as a compound having an interactive group and capability of directly chemically bonding to the substrate, when generating the graft polymer. Examples thereof include monomers which have functional groups such as a carboxyl group, a sulfonic group, a phosphoric group, an amino group or salts thereof, a hydroxyl group, an amide group, a phosphine group, an imidazole group, a pyridine group or salts thereof, or an ether group: for example, (meth)acrylic acid or an alkali metal salt or amine salt thereof, itaconic acid or an alkali metal salt or amine salt thereof, 2-hydroxyethyl(meth)acrylate, (meth)acrylamide, N-monomethylol(meth)acrylamide, N-dimethylol(meth)acrylamide, allylamine or a hydrohalic acid salt thereof, 3-vinylpropionic acid or an alkali metal salt or an amine salt thereof, vinylsulfonic acid or an alkali metal salt or an amine salt thereof, 2-sulfoethyl(meth)acrylate, polyoxyethyleneglycol mono(meth)acrylate, 2-acrylamide-2-methylpropanesulfonic acid, acid phosphooxy polyoxyethyleneglycol mono(metha)acrylate, and N-vinyl pyrrolidone (structure as shown below). These monomers may be used singly on their own, or in combinations of two or more thereof.

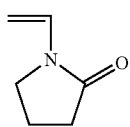

(Polymers which have an Interactive Group and which Directly Chemically Bond to a Substrate)

Examples of a polymer that contains an interactive group and that directly chemically bonds to the substrate include polymers generated from a monomer containing an interactive group. Moreover, a preferably used polymer is a polymer containing a polymerizable group and an interactive group, i.e., a homopolymer or copolymer obtained using at least one monomer with an interactive group, into which an ethylene addition polymerizable unsaturated group (polymerizable group) such as a vinyl group, an allyl group, and a (meth) acrylic group is introduced as the polymerizable group. Such a polymer containing a polymerizable group and an interactive group has a polymerizable group at least at a terminal end or side chain thereof, wherein the polymerizable group is preferably present at a terminal end, and is more preferably present at both of a terminal end and at a side chain.

In the present invention, the reason that a polymer containing a polymerizable group and an interactive group is preferably used is as follows. Namely, performing graft polymerization with a monomer using a method of immersing in a monomer solution is difficult to be used for mass production, considering manufacturability. Moreover, in a method of coating a monomer solution, it is especially difficult to maintain uniformity of the monomer solution on a base material up till light-irradiation. Furthermore, although a method is known of, after coating a monomer solution, covering with a film or the like, it is difficult to carry out such covering uniformly, and the covering operation itself becomes necessary, leading to a complicated operation. However, in contrast, if a polymer is used, it becomes solid after being applied, and therefore a uniform film can be formed and mass production is facilitated.

The following monomers may be used as a monomer containing an interactive group for synthesizing the above polymer. Examples thereof include monomers which have functional groups such as a carboxyl group, a sulfonic group, a phosphoric group, an amino group or salts thereof, a hydroxyl group, an amide group, a phosphine group, an imidazole group, a pyridine group or salts thereof, or an ether group: for example, (meth)acrylic acid or an alkali metal salt or amine salt thereof, itaconic acid or an alkali metal salt or amine salt thereof, 2-hydroxyethyl(meth)acrylate, (meth)acrylamide, N-monomethylol(meth)acrylamide, N-dimethylol(meth) acrylamide, allylamine or a hydrohalic acid salt thereof, 3-vinylpropionic acid or an alkali metal salt or an amine salt thereof, vinylsulfonic acid or an alkali metal salt or an amine salt thereof, 2-sulfoethyl(meth)acrylate, polyoxyethyleneglycol mono(meth)acrylate, 2-acrylamide-2-methylpropanesulfonic acid, acid phosphooxy polyoxyethyleneglycol mono (metha)acrylate, and N-vinylpyrrolidone (structure as shown below). These monomers may be used singly on their own, or in combinations of two or more thereof.

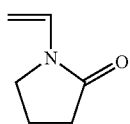

The polymer containing a polymerizable group and an interactive group may be synthesized as follows.

Examples of synthesis methods include:

i) a method of copolymerizing a monomer containing an interactive group with a monomer containing a polymerizable group;

ii) a method of copolymerizing a monomer containing an interactive group with a monomer containing a double bond precursor, and then introducing a double bond thereinto by treatment with a base or the like; and iii) a method of reacting a monomer containing an interactive group with a monomer containing a polymerizable group, and then introducing a double bond (introducing a polymerizable group) thereinto.

From the standpoint of polymerizability, preferred are the methods of ii) copolymerizing a monomer containing an interactive group with a monomer containing a double bond precursor, and then introducing a double bond thereinto by treatment with a base or the like; and iii) reacting a monomer containing an interactive group with a monomer containing a polymerizable group, and then introducing a polymerizable group thereinto.

As the monomer containing an interactive group used for synthesizing the polymer containing a polymerizable group and an interactive group, the aforementioned monomer containing an interactive group may be used as a monomer containing an interactive group. Monomers may be used singly on their own, or in combinations of two or more thereof.

As the monomer containing a polymerizable group to be copolymerized with a monomer containing an interactive group, allyl(meth)acrylate, 2-allyloxyethyl methacrylate, and the like can be mentioned.

As the monomer containing a double bond precursor, 2-(3-chloro-1-oxopropoxy)ethyl methacrylate, 2-(3-bromo-1-oxopropoxy)ethyl methacrylate, and the like can be mentioned.

As the monomer containing a polymerizable group to be used for introducing an unsaturated group by reaction with a functional group in a polymer having an interactive group, such as a carboxyl group, an amino group or a salt thereof, a hydroxyl group or an epoxy group, (meth)acrylate, glycidyl (meth)acrylate, allyl glycidyl ether, 2-isocyanatoethyl (meth) acrylate, and the like can be mentioned.

Moreover, a macro-monomer may also be used in the present invention. Various manufacturing methods are proposed for the manufacturing method of a macro-monomer applicable to the present invention, such as, for example, those described in the Chapter 2 of "Macro-monomer Synthesis" in "Chemistry and Industry of Macro-monomer" (edited by Yuya YAMASHITA, published by IPC, Sep. 20, 1989).

Particularly applicable as the macro-monomer used in the present invention are: macro-monomers derived from a monomer containing a carboxyl group, such as acrylic acid or methacrylic acid and the like; sulfonic macro-monomers derived from a monomer such as 2-acrylamide-2-methylpropanesulfonic acid, vinyl styrene sulfonic acid or salts thereof; amide macro-monomers derived from a monomer such as (meth)acrylamide, N-vinylacetamide, N-vinylformamide, N-vinyl carboxylic acid; macro-monomers derived from a monomer containing a hydroxyl group, such as hydroxyethyl methacrylate, hydroxyethyl acrylate, glycerol monomethacrylate and the like; and macro-monomers derived from a monomer containing an alkoxy group or an ethylene oxide group, such as methoxyethyl acrylate, methoxy polyethylene glycol acrylate, and polyethylene glycol acrylate. Moreover, monomers which have a polyethylene glycol chain or a polypropylene glycol chain may also be applied as the macro-monomer used in the present invention.

The range of useful molecular weights of these macro-monomers is from 250 to 100,000, and a particularly preferable range is from 400 to 30,000.

There are no particular limitations to the solvent used for the composition containing the monomer containing an interactive group or the polymer containing a polymerizable group and an interactive group, as long as the monomer containing an interactive group, the polymerizable group, and the interactive group, which are the principal components of the composition, are soluble therein. A surfactant may also be added to the solvent.

Examples of solvents which can be used include, for example: alcohol solvents such as methanol, ethanol, propanol, ethylene glycol, glycerol, and propylene glycol monomethyl ether; acids like acetic acid; ketone solvents such as acetone, and cyclohexanone; and amide solvents such as formamide and dimethylacetamide.

Surfactants which may be added to the solvent as required may be any surfactant that dissolves in the solvent, and such surfactants include, for example: anionic surfactants, such as n-sodium dodecylbenzenesulfonate; cationic surfactants such as n-dodecyl trimethylammonium chloride; and nonionic surfactants such as polyoxyethylene nonylphenol ether (commercially available as, for example, EMULGEN 910, made by Kao Corporation, and the like), polyoxyethylene sorbitan monolaurate (commercially available as, for example, trade name "TWEEN 20" and the like), and polyoxyethylene lauryl ether.

When the composition is contacted in a liquid state, this may be carried out as desired, however, the coating amount for a coating layer of a composition containing an interactive group is preferably from 0.1 to 10 g/m$^2$ solids equivalent, and is particularly preferably from 0.5 to 5 g/m$^2$, from the standpoints of ensuring sufficient interaction with metal ions and the like, and obtaining a uniform coating film.

Energy Application

Heating, and radiation irradiation, such as light-exposure, and the like may be used as the energy application method to the base material surface. For example, light-irradiation by a UV lamp, visible light radiation, or the like, and heating with a hot plate or the like may be carried out. Examples of such a light source include a mercury-vapor lamp, a metal halide lamp, a xenon lamp, a chemical lamp, a carbon arc light, and the like. Examples of radiation that may be used include an electron beam, X-rays, an ion beam, far-infrared radiation, and the like. Moreover, g-line, i-line, Deep-UV light, and a high-density energy beam (laser beam) may also be used.

Specific modes for energy application generally used include direct image-pattern recording using a thermal recording head or the like, scanning light-exposure using an infrared laser, high luminosity flash light-exposure using a xenon electric-discharge lamp or the like, and infrared lamp light-exposure.

The duration of energy application depends on the amount of the target graft polymer to be generated and on the light source used, but is normally between 10 seconds and 5 hours.

The polymer layer (graft polymer layer), which includes a polymer containing an interactive group, may be formed on a base material according to the step (a1) as explained above.

Step (a2)

In the step (a2), a metal ion or a metal salt is applied to the polymer layer formed in the step (a1). In this step, the interactive group of the graft polymer configuring the polymer layer adheres (adsorbs) the applied metal ions or metal salts according to the function of the interactive group.

Metal Ions or Metal Salts

The metal ion or metal salt will be described.

There are no particular limitation to the metal salt, as long as it dissolves in a solvent suitable for applying to the polymer layer, and as long as it dissociates to a metal ion and a base (anion), and preferable examples of such a metal salt include $M(NO_3)n$, $MCln$, $M_{2/n}(SO_4)$, and $M_{3/n}(PO_4)$ (wherein M represents a n-valent metal atom). As a metal ion, a dissociated ion of the above metal salt is preferably used.

The metal ion or the metal salt in the present invention are preferably a metal ion or a metal salt of a metal selected from the group consisting of copper, silver, gold, nickel, and chromium, from the standpoints of the reduced metal not being readily oxidized and being suitable as an electrical material.

Application Method of Metal Ion and Metal Salt

The method used for applying the metal ion or the metal salt may be suitably selected in consideration of the compound forming the graft polymer configuring the polymer layer. Moreover, the graft polymer preferably contains a hydrophilic group, from the standpoint of adhesion of metal ions and the like. As the hydrophilic group, specifically, a carboxyl group, a sulfonyl group and a hydroxyl group are preferable.

Specific methods which may be selected and used for applying the metal ion or metal salt include:

(i) a method of allowing the metal ion to be adsorbed to the ionic group of the graft polymer, when the graft polymer contains an ionic group (polar group) as the interactive group;

(ii) a method of impregnating the graft polymer with the metal salt or a solution containing the metal salt, when the graft polymer is a polymer having high affinity to a metal salt, such as polyvinyl pyrrolidone; and (iii) a method of immersing the graft polymer in a solution containing or dissolving the metal salt, and impregnating the graft polymer with the metal salt and/or a solution containing the metal salt, when the graft polymer is hydrophilic:

In particular, according to the above method (iii), properties of the graft polymer is not particularly limited and desired metal ion or metal salt may be applied thereto.

In the application of the metal ion or the metal salt to a polymer layer, when the above method (i) of allowing the metal ion to be adsorbed to the ionic group of the graft polymer is used, the above metal salts may be dissolved in a suitable solvent, and the resultant solution containing the dissociated metal ions may be applied onto a substrate surface that has been formed with a polymer layer, or the substrate formed with the polymer layer may be immersed in such a solution. By contacting the solution containing the metal ions, the metal ions can be adsorbed to the ionic groups. From a standpoint of carrying out sufficient adsorption, it is preferable that the concentration of the metal ion or metal salt in the solution is in the range from 1 to 50 mass %, and the range from 10 to 30 mass % is more preferable. Moreover, the contact time is preferably from about 10 seconds to 24 hours, and is more preferably from about 1 minute to 180 minutes.

In the application of the metal ion or the metal salt to a polymer layer, when (ii) the graft polymer is a polymer having high affinity to a metal salt such as polyvinyl pyrrolidone, the metal salt may be attached directly to the polymer layer in the form of microparticles, or may be applied by coating or immersing a substrate surface having the polymer layer thereon with a solution containing dissociated metal ions obtained by dissolving the metal salt with a suitable solvent. By contacting to the solution containing metal ions, the metal ions can be ionically adsorbed to the aforementioned ionic groups. Moreover, when the graft polymer includes a hydrophilic compound, the graft polymer can be impregnated with a dispersion of the metal salt by means of a high water retention ability of the graft polymer. The metal salt concentration of the dispersion liquid, or metal salt concentration, is preferably in the range of from 1 to 50 mass %, and is still more preferably in the range of from 10 to 30 mass %, from a standpoint of ensuring sufficient impregnation with the dispersion. Moreover, the contact time is preferably from about 10 seconds to 24 hours, and is more preferably about 1 minute to 180 minutes.

In application of the metal ion or the metal salt to the graft polymer, when employing method (iii) of immersing a glass substrate having a polymer layer of a hydrophilic graft polymer in a liquid containing the metal salt or in a solution in which the metal salt is dissolved, and impregnating the polymer layer with the metal ions and/or the liquid containing the metal salt, the metal salt can be applied by preparing a dispersion of the metal salt using a suitable solvent or preparing a solution of the dissociated metal ions, and applying the dispersion or solution to a substrate surface having the polymer layer or immersing the substrate in the dispersion or solution. In this way also, as described above, the hydrophilic graft polymer can be impregnated with the dispersion or solution by means of a high water retention ability of the graft polymer. The metal salt concentration of the dispersion liquid, or metal salt concentration, is preferably in the range of from 1 to 50 mass %, and is still more preferably in the range of from 10 to 30 mass %, from a standpoint of ensuring sufficient impregnation with the dispersion or solution. Moreover, the contact time is preferably from about 10 seconds to 24 hours, and is more preferably about 1 minute to 180 minutes.

—Relationship Between the Polarity of the Functional Group of the Graft Polymer and the Metal Ion or Metal Salt—

When the graft polymer has a functional group having a negative charge, a region on which a simple element of metal (metal film or metal microparticles) is deposited can be formed by allowing metal ions having a positive charge to be adsorbed to the functional groups having a negative charge, and then reducing the adsorbed metal ions.

—Relationship Between the Polarity of a Hydrophilic Group of a Hydrophilic Compound Bonding Type and the Metal Ion or Metal Salt—

When the graft polymer has, as explained above, an anionic group such as a carboxyl group, a sulfonic group or a phosphonic acid group as a hydrophilic functional group, the graft polymer can be selectively negatively charged, and a metal (particle) film region (wiring) can be formed by allowing metal ions having a positive charge to be adsorbed to the functional groups, and then reducing the adsorbed metal ions.

On the other hand, when the graft polymer chain has a cationic group such as an ammonium group, like those described in JP-A No. 10-296895, the polymer is selectively positively charged, and a metal (particle) film region (wiring) can be formed by impregnating the graft polymer with a solution containing the metal salt or a solution dissolving the metal salt, and then reducing the metal ions in the solution or in the metal salts. Such metal ions are preferably bonded to the hydrophilic groups of the hydrophilic surface at an amount of as much as possible, from the standpoint of durability of bonding.

Methods for applying the metal ions to the hydrophilic groups include: a method of coating a solution in which metal ions or a metal salt has been dissolved or dispersed onto a support surface; and a method of immersing a support surface into such a solution or dispersion. In either way of coating and immersion, an excessive quantity of metal ions are supplied, and the contact duration is preferably from about 10 seconds to about 24 hours, and is still more preferably from about 1 minute to about 180 minutes, so that sufficient ionic bonding with the hydrophilic groups is introduced.

The metal ions or the metal salt may be used singly or in combination of two or more. Moreover, in order to achieve desired conductivity, plural materials may be used by mixing in advance.

In a conductive layer formed by the below-mentioned processes, it may be confirmed, by surface observations and cross-section observations using an SEM and AFM, that the metal particles are dispersed compactly at the surface graft film. The particle sizes of the metal particles formed are from about 1 nm to 1 μm.

Step (a3)

In the step (a3), the metal ion or metal salt, applied to the polymer layer in the step (a2) above is reduced, thereby forming a conductive layer having a surface resistivity of from 5 Ω/square to 100 kΩ/square.

Reducing Agent

In the present step, the metal salt or metal ion that has been adsorbed to or impregnated in the graft polymer is reduced. The reducing agent used to form the conductive layer is not particularly limited, as long as it has a property of reducing the metal salt compound that has been used to allow the metal to separate out, and examples thereof include a hypophosphite salt, a tetrahydroboric acid salt, hydrazine, and the like.

The reducing agent is suitably chosen according to their relationship with the metal salt or metal ion used. The reducing agent is preferably sodium tetrahydroborate when an aqueous solution of silver nitrate or the like is used as an aqueous metal salt solution for supplying metal ions or metal salt; and is preferably hydrazine when an aqueous solution of palladium dichloride is used.

Examples of the addition method of the above reducing agent include, for example: a method of applying metal ions or metal salt to a substrate surface which has a polymer layer thereon, washing with water and removing excess metal salt or metal ions, then immersing the substrate in ion exchange water or the like, and adding a reducing agent thereto; and a method of directly coating or dripping an aqueous solution containing the reducing agent at a given concentration onto such a substrate surface. An excess quantity of the reducing agent, i.e., more than the equivalent amount to the metal ions, is preferably used as the addition amount thereof, and it is still more preferable that the addition amount is more than 10 times the equivalent amount.

The presence of a uniform, high strength, conductive layer due to the addition of the reducing agent may be checked with the naked eye from a metallic luster of the surface, and the structure thereof may be checked by observing the surface using a transmission electron microscope or an AFM (atomic force microscope). Moreover, the film thickness of the metal (particles) film may be readily measured by a conventional method such as, for example, observation of a cut face with an electron microscope.

Formation of Conductive Layer by Applying Electroless Plating

In the step (a3), it is also preferable to provide a conductive layer having a surface resistivity of 5 Ω/square to 100 kΩ/square by applying an electroless plating liquid to the polymer layer to which the metal ion or metal salt has been applied, reducing the metal ion or metal salt to the metal and, at the same time, performing electroless plating while using the metal as an electroless plating catalyst.

Electroless Plating

An electroless plating means such operation as depositing metal through a chemical reaction while using a solution dissolving a metal ion to be plated.

The application of the electroless plating liquid in the step (a3) can be preferably performed, for example, by providing the polymer layer with the metal ion or metal salt in the step (a2), subsequently washing with water to remove excessive metal salts and the like, and dipping the resulting product in an electroless plating bath containing a metal ion to be plated and a surface charge-controlling agent. For other components than the surface charge-controlling agent usable as the electroless plating bath, generally known electroless plating baths may be used.

The composition of general electroless plating bath mainly includes 1. a metal ion to be plated, 2. a reducing agent, and 3. an additive for improving the stability of the metal ion (stabilizer). In the present step, 4. a surface charge-controlling agent is further contained. In addition to these, the plating bath may contain a publicly known additives such as a stabilizer of the plating bath, and the like.

Copper, tin, lead, nickel, gold, palladium and rhodium are known as the metal for use in the electroless plating bath. Among these, from the standpoint of the electric conductivity, copper and gold are particularly preferable.

In addition, there are optimum reducing agents and additives corresponding to the aforementioned metals. For example, an electroless plating bath of copper contains $Cu(SO_4)_2$ as a copper salt, HCOH as an reducing agent, and a chelating agent such as EDTA and Rochelle salt being a stabilizer for copper ions as an additive. An electroless plating bath for use in electroless plating of CoNiP contains cobalt sulfate and nickel sulfate as a metal salt, sodium hypophosphite as a reducing agent, and sodium malonate, sodium malate and sodium succinate as a chelating agent. An electroless plating bath of palladium contains $(Pd(NH_3)_4)Cl_2$ as an metal ion, $NH_3$ and $H_2NNH_2$ as a reducing agent, and EDTA as a stabilizer. These plating baths may contain a component other than the aforementioned components.

Step (a4)

In the step (a4), a pattern-shaped resist layer is formed on the conductive layer having a surface resistivity of from 5 $\Omega$/square to 100 k$\Omega$/square formed in the step (a3).

Such a resist layer may be formed using a photosensitive resist. Photosensitive resists which may be used include photo-curable negative-working resists and photo dissolution positive-working resists that are dissolved by light-exposure.

Examples of photosensitive resists which may be used include: 1. photosensitive dry film resists (DFR); 2. liquid resists; and 3. ED (electrodeposition) resists. These each have their own respective characteristics. Namely, the photosensitive dry film resists (DFR) may be used dry and so their handling is simple. The liquid resists may be made into thin film thickness resists, and so are capable of making patterns with good resolution. The ED (electrodeposition) resists may be made into thin film thickness resists, and so are capable of making patterns with good resolution, and their following characteristics to irregularities on the coating surface are good, and adhesiveness is excellent. The photosensitive resist to be used may be selected in consideration of such characteristics.

When using each of above respective photosensitive resists, the resist may be disposed on the conductive layer formed in the step (a3) in the following manner.

1. Photosensitive Dry Film

A photosensitive dry film generally is sandwiched between a polyester film and a polyethylene film, and is pressure-applied by pressing with a hot roll while releasing the polyethylene film by a laminator.

Formulation, film production methods, and laminating methods of photosensitive dry film resists are described in detail in the specification of JP-A No. 2006-284842, at paragraph numbers [0192] to [0372], submitted previously by the present applicant, and the descriptions therein may also be applied in a similar manner in the present invention.

2. Liquid Resist

Coating methods include spray coating, roll coating, curtain coating, and dip coating. For coating both sides at the same time, roll coating and dip coating are preferable from these methods, since coating both sides at the same time is possible thereby.

Liquid resists are described in detail in the specification of JP-A No. 2007-010785, at paragraph numbers [0199] to [0219], submitted previously by the present applicant, and the descriptions therein may also be applied in a similar manner in the present invention.

3. ED (Electrodeposition) Resist

ED resists are colloid products formed by suspending fine particles of photosensitive resist in water, and since the particles are charged, when a voltage is applied to the conductor layer, a resist deposits by electrophoresis on the conductor layer, and the colloid bond with each other on the conductor to form a film, and a coating may be formed.

Next, pattern light-exposure and development are performed.

In pattern light-exposure, the base material formed with the resist film on the upper portion of the metal film is adhered to a mask film or a dry plate, and exposed to light in the light-sensitive region of the resist used. When using a film, the film may be adhered in a vacuum baking frame, and exposed. The source of light-exposure may be a point light source if the pattern width is about 100 μm. When forming patterns of widths of 100 μm or less, a parallel light source is preferably used.

Any substance may be used for development as long as it can dissolve unexposed portions when the resist is a photo-curable negative-working type, or exposed portions when the resist is a photo dissolution positive-working type which dissolves by light exposure. However, organic solvents and alkali aqueous solutions are mainly used, and alkali aqueous solutions are preferably used from a standpoint of environmental impact reduction.

Step (a5)

In the step (a5), subsequently to the step (a4), a metal pattern is formed by electroplating on the region where the resist layer is not formed. Namely, at this step, by using as a base the conductive layer formed in step (a3), and by further performing electroplating, a pattern-shaped conductive layer is formed with excellent adhesiveness to a substrate, provided with sufficient conductivity.

It should be noted that before carrying out the electroplating of step (c5), it is preferable to perform degreasing and washing to remove any residue from the resist development of the previous process, and to remove any oxide coating present that may be formed on the surface, which has been exposed to light in a previous process, of the conductive layer formed in the step (c3).

Distilled water, a dilute acid, or a dilute oxidizing agent aqueous solution may be used for such degreasing and washing, and a dilute acidic oxidizing agent aqueous solution is preferably used. Hydrochloric acid and sulfuric acid may be used as such an acid, and hydrogen peroxide and ammonium persulfate may be used as such an oxidizing agent. The concentration of the acidic oxidizing agent is preferably from 0.01 mass % to 1 mass %, and the treatment is preferably conducted at a temperature of from room temperature to 50° C., for 1 to 30 minutes.

Known conventional methods may be used for the electroplating method.

Examples of the metal used for electroplating in this step include copper, chromium, lead, nickel, gold, silver, tin, zinc, and the like. From a standpoint of the conductivity thereof, copper, gold, and silver are preferable, and copper is more preferable.

An additive is preferably included in the electroplating bath used for the electroplating in this step, from a standpoint of improving characteristics of the metal film when applied to electronic circuits, such as the smoothness, extendibility, and conductivity characteristics.

Commercial electroplating additives for electroplating may be used as such an additive. Specific examples of such additives include, for example, janus green B (JGB), SPS (sulfopropylthiorate), polyethylene glycol, various kinds of surfactants, and the like. Moreover, mixtures thereof marketed by metal plating liquid manufacturers may be used, such as the COPPER GLEAM series made by Meltex Incorporated, the TOP LUCINA series made by Okuno Chemical Industries Co., Ltd., and the CU-BRITE Series made by Ebara-udylite Co., Ltd. These may be selected according to the mechanical characteristics of the metal film to be obtained, and the like.

Specific modes of the type and addition amount of the additive may be suitably adjusted in consideration of various characteristics, such as speed of electroplating, current density during electroplating, and internal stress of the metal film formed. Specifically, the chemical concentration of such an additive may be from 0.1 mg/L to 1.0 mg/L, and for a commercial electroplating liquid from 1 ml/L to 50 ml/L may be added (depending to each manufacturer's catalog).

In the step (a5), the electroplating is preferably performed at a current density of from 0.1 mA/cm$^2$ to 3 mA/cm$^2$ until the consumption of quantity of electricity reaches from 1/10 to 1/4 of the total consumption of quantity of electricity required from the commencement of electric current flow to the termination of electric current flow. By performing the electroplating in this step at a small current density for a certain period of time from the start of current flow, a uniform metal coating film can be formed on a substrate having a relatively high surface resistance, and a fine metal film having excellent electrical conductivity and applicability to electronic circuits can be formed, due to the slow growth of the metal film.

The period for performing electroplating at the current density within the above range may be suitably set according to the application or properties and the like of the metal film to be formed, within the time period in which the consumption of quantity of electricity reaches from 1/10 to 1/4 of the total consumption of quantity of electricity required from the commencement of electric current flow to the termination of electric current flow. Moreover, the amount of the current density may also be suitably set within the above range.

The electroplating in this step is further performed by increasing the current density, after performing for a certain time period at a small current density in the above range. The degree of increasing the current density may be appropriately adjusted, but is normally from 2 to 20 times, preferably from 3 to 5 times the current density at the commencement of electric current flow.

There are no particular limitations to the mode of increasing the current density, and modes which may be adopted include a linear increase, a stepwise increase, and an exponential increase. The current density is preferably increased linearly, from the standpoint of uniformity in the metal plating coating film.

The film thickness of the metal pattern formed by electroplating differs according to the application, and may be controlled by adjusting the metal concentration in the plating bath, immersion duration therein, or the current density. It should be noted that the film thickness when applied to general electrical wiring and the like, from the standpoint of conductivity thereof, is preferably 0.3 µm or more, and is more preferably 3 µm or more.

The surface resistivity of the metal pattern formed in step (a5) is $1 \times 10^{-1}$ Ω/square or less, and is preferably $1 \times 10^{-2}$ Ω/square or less.

It should be noted that the surface resistivities in the present specification adopt values measured according to a four terminal four probe method and a constant current method, using a resistivity meter, LORESTA EP-MCP-T360, made by Dia Instruments Co., Ltd.

Step (a6)

In the step (a6), the resist layer is separated subsequent to the formation of the metal pattern in step (a5).

Separation can be performed by spraying with a release liquid. Although release liquids vary depending on the type of resist, generally a solvent or a liquid that cause the resist to swell is sprayed to separate the swelled resist.

Step (a7)

In the step (a7), the resist layer is removed from the region that has been protected by the conductive layer formed in the step (a3).

Removal of the conductive layer is performed by dissolution and removal of the conductive layer. Dissolution and removal may be performed using, as a conductive layer removing liquid, an aqueous solution containing a chelating agent for promoting dissolution of a metal salt, an oxidizing agent for oxidizing and ionizing the metal, an acid for dissolving the metal, and the like, and immersing the substrate in the removing liquid or spraying the removing liquid on the substrate.

The chelating agents include commercially available metal chelating agents such as EDTA, NTA, phosphoric acid, organic amine and sulfur compounds. The chelating agent can be selected from a chelating agent capable of coordinating to the metal in the conductive layer.

Specific examples capable of being used as the chelating agents include compounds described in "DOJINDO Laboratories 17 Edition/Overall Catalogue" published by DOJINDO LABORATORIES. For example, when the conductive layer is made of copper, the use of chelating agents such as EDTA and NTA, organic amines such as imidazole, pyridine and benzotriazole, and a sulfur compound such as mercaptothiazole is preferable. When the conductive layer is made of silver, the use of organic amines such as imidazole and pyridine, sulfur compounds such as mercaptothiazole and 1-(2'-ethylsulfonate)-5-mercaptotetrazole, chelating agents such as hypo and 1,4,5-trimethyl-1,2,4-tetrazonium-3-thiolate is preferable.

The concentration of the chelating agent is preferably of from 0.1 mass % to 10 mass % relative to the total mass of the aqueous solution containing the chelating agent, preferably form 1 mass % to 5 mass %.

The oxidizing agents include hydrogen peroxide, peracid (such as hypochlorous acid and persulfuric acid), oxidizing metal salts such as an iron EDTA salt and cerium salt, among which hydrogen peroxide and persulfuric acid are preferably used.

The concentration of the oxide is preferably from 0.1 mass % to 10 mass % relative to the total mass of the aqueous solution containing the oxide, more preferably from 1 mass % to 5 mass %.

The acids include sulfuric acid, hydrochloric acid, nitric acid and the like. The concentration of the acid is preferably from 0.1 mass % to 10 mass % relative to the total mass of the aqueous solution, more preferably from 0.5 mass % to 5 mass %.

For the aqueous solution for use in dissolving and removing the conductive layer in this step, an aqueous solution containing the combination of the oxidizing agent, the chelating agent and the acid is preferable. The pH value of the aqueous solution for use in dissolving and removing the conductive layer is preferably within the range of 0 to 6. For the purpose of adjusting the pH within the range, a buffering agent may be added. As the buffering agent, organic or inorganic acids such as acetic acid, phthalic acid and phosphoric acid may be used.

The treatment temperature when performing the dissolution and removal of the conductive layer is preferably in the range of from room temperature to 60° C. However, in order to accelerate or decelerate the reaction, the temperature may be set to higher or lower as compared with the range. The treatment time is preferably from several seconds to 30 minutes. A too long treatment time damages the conductive layer (metal pattern) formed by the electroplating. Therefore, a short time treatment is preferable.

Step (a8)

In the step (a8), a hydrophobilizing treatment is performed at the polymer layer, that has been provided in the step (a1), and that is present in the region from which the conductive layer has been removed in the step (a7).

The hydrophobilizing treatment is preferably a treatment in which a hydrophobilizing agent is applied to the polymer layer to react the hydrophobilizing agent and the polymer including the polymer layer (hereinafter, sometimes simply referred to as "polymer").

As the hydrophobilizing agent, a metal forming a hydrophobic salt with the polymer, or an organic reaction reagent reacting with the polymer to form a hydrophobic compound is preferably used.

The metals capable of forming a hydrophobic salt with the polymer includes silver, iron, zinc, aluminum, calcium and the like are mentioned. In particular, polyvalent metals have a high hydrophobilizing ability, and zinc, aluminum and calcium are preferably used.

As the organic reaction reagent, various kinds of alkylating agents are preferably used, and Schiff base salt of various kinds of alcohols ($BF_3$/methanol), acetals such as dimethylformamide acetal, and active esters such as dimethyl sulfate are preferably used.

As the interaction group possessed by the graft polymer, as stated above, a hydrophilic carboxyl group, sulfonyl group and hydroxyl group are preferable. As the hydrophobilizing agent that hydrophobilizes these hydrophilic groups, polyvalent metal salts and alkylating agents are preferable.

Methods of applying the hydrophobilizing agent to the polymer layer includes such methods as i) preparing an aqueous solution dissolving the hydrophobilizing agent therein, or a treatment solution obtained by dissolving it in various organic solvents, and applying the aqueous solution or the treatment solution to the polymer layer, and ii) in the case of organic reagent or the like, making it into gas and applying the same to the polymer layer in the gas phase. Among these application methods, the method of applying an aqueous solution or treatment solution, which is a simpler and easier method, is preferably used.

Meanwhile, when a metal forming a hydrophobic salt with the polymer is used as the hydrophobilizing agent, in the preparation of the aqueous solution or treatment solution containing a hydrophobilizing agent, a metal salt including a metal that forms a hydrophobic salt with the polymer may be dissolved in a solvent to prepare the aqueous solution or treatment solution.

For the solvent, in addition to water, hydrophilic organic solvents such as an alcohol, acetone and DMSO are preferably used because they accelerate the penetration of the hydrophobilizing agent into the polymer.

When performing the application of the hydrophobilizing agent using an aqueous solution dissolving the hydrophobilizing agent or a treatment solution obtained by dissolving the agent in various kinds of organic solvents, the concentration of the hydrophobilizing agent in the aqueous solution or treatment solution is preferably from 0.1 mass % to 10 mass %, more preferably from 1 mass % to 5 mass %.

The duration time required for the hydrophobilizing treatment is preferably from 10 seconds to 30 minutes. In order to shorten the step, it is preferable that a short-time treatment is preferable. In order to perform a short-time treatment, it is sufficient to increase the stirring speed of the treatment bath, or to increase the temperature of the treatment liquid.

The treatment temperature of the hydrophobilizing treatment is preferably in the range of from room temperature to 60° C. For the purpose of accelerating the reaction, a higher temperature than the aforementioned range may be employed.

Metal Pattern Forming Method (2)

A second aspect of the metal pattern forming method of the present invention is a metal pattern forming method including the steps of:

(b1) a step of providing, on a substrate, a polymer layer that comprises a polymer containing a functional group that interacts with a metal colloid, the polymer directly chemically bonding to the substrate;

(b2) a step of applying a metal colloid to the polymer layer to form a conductive layer having a surface resistivity of from 5 Ω/square to 100 kΩ/square;

(b3) a step of forming a pattern-shaped resist layer on the conductive layer having a surface resistivity of from 5 Ω/square to 100 kΩ/square;

(b4) a step of forming, in a region where the resist layer is not formed, a metal pattern by electroplating;

(b5) a step of separating the resist layer;

(b6) a step of removing the conductive layer formed in the step (b2) from the region that has been protected by the resist layer; and (b7) a step of performing a hydrophobilizing treatment to the polymer layer that has been provided in the step (b1) and exists in the region from which the conductive layer has been removed in the step (b6).

Namely, the metal pattern forming method (2) includes a step (b2) of applying a metal colloid to the polymer layer and forming the conductive layer having a surface resistivity of from 5 Ω/square to 100 kΩ/square, in place of steps (a2) and (a3) of the metal pattern forming method (1).

Step (b1)

In the step (b1), a polymer layer is provided on a substrate, the polymer layer including a polymer containing a functional group (an interactive group) that interacts with a metal colloid, and directly chemically bonding to the substrate. The step (b1) in the metal pattern forming method (2) is similar to the step (a1) in the metal film forming method (1), and preferable modes thereof are also similar.

Step (b2)

In step (b2), a metal colloid is applied to the polymer layer formed in step (b1), and a conductive layer having a surface resistivity of from 5 Ω/square to 100 kΩ/square is formed thereon. Namely, in this step, the interactive group of the graft polymer which configures the polymer layer adheres (adsorbs) the applied metal colloid, according to the function of the group, thereby forming the conductive layer having a surface resistivity of from 5 Ω/square to 100 kΩ/square.

Metal Colloid

The metal colloid applied to this step is mainly a zero-valent metal, and examples thereof include Pd, μg, Cu, Ni, Al, Fe, Co, and the like. In the present invention, Pd and Ag are particularly preferable due to their good handling characteristics, and their high level of catalyzing ability. A metal colloid which has been charge-adjusted is generally used in a technique of attaching a zero-valent metal to the graft polymer (interactive region), and such a metal colloid can be produced by reducing metal ions of the above metal in a solution in the presence of a charged surfactant or a charged protective agent. The charge may be varied by the surfactant used, and selectively adsorbed to the graft pattern by the interaction with the interactive group on the graft pattern.

Metal Colloid Application Method

Methods for applying the metal colloid to the graft polymer include: a method of dispersing the metal colloid in a suitable dispersion medium, or dissolving a metal salt in a suitable solvent, and coating a liquid containing the dissociated metal ions onto the substrate surface carrying the graft polymer, or immersing the substrate carrying the graft polymer in such a dispersion or solution. By contacting the solution containing the metal ions, the metal ions can be adsorbed to the interactive group of the patterned portions, using ion-ion or bipolar-ion interaction. From a standpoint of carrying out sufficient adsorption, it is preferable that the metal ion concentration, or metal salt concentration, of the solution for contacting is in the range from 1 to 50 mass %, and the range from 10 to 30 mass % is still more preferable. Moreover, the contact time is preferably from about 1 minute to 24 hours, and it is more preferably from about 5 minutes to 1 hour.

In addition, in the step (b2), it is also possible to apply a metal colloid to the polymer layer and, by performing electroless plating while using the metal colloid as an electroless plating catalyst, to form an electroconductive layer having a surface resistivity of from 5 Ω/square to 100 kΩ/square. For the electroless plating, the item in the description about the step (a3) is applicable to the step (b2) in the same way.

Step (b3) to Step (b7)

The steps (b3) to (b7) in the metal pattern forming method (2) are similar to respective steps (a4) to (a8) in the metal pattern forming method (1), and preferable modes thereof are also similar.

Metal Pattern

The metal pattern of the invention is the metal pattern that is obtained by the method for forming a metal pattern of the invention.

The metal pattern which is obtained by the present invention preferably have a metal pattern provided on a substrate having surface irregularities of no more than 500 nm, and more preferably no more than 100 nm. Moreover, the adhesiveness of such a substrate and such a metal film is preferably 0.2 kN/m or more. Namely, there is excellent adhesiveness between the substrate and the metal film, even though the substrate surface is smooth.

In addition, the metal pattern obtained by the present invention is a metal pattern having an excellent insulation reliability where a region in which the metal pattern is not present has high insulating property.

More specifically, the metal pattern which is obtained in the present invention is formed by: providing, on a substrate with surface irregularities of no more than 500 nm, preferably no more than 100 nm, a polymer layer which includes a polymer that has an interacting ability and directly chemically bonds to the substrate; applying a metal ion or a metal salt to the polymer layer; reducing and depositing a metal, or applying a metal colloid to the polymer layer and thereafter performing electroplating. The adhesiveness between the substrate and the metal film is preferably 0.2 kN/m or more, more preferably 0.3 kN/m or more, particularly preferably 0.7 kN/m or more.

Here, although there is no upper limit to the value of the above adhesiveness, a sensible range is from about 0.2 to about 2.0 kN/m. In addition, the value of the adhesiveness of a substrate to a metal pattern in a conventional metal pattern is commonly from about 0.2 to about 3.0 kN/m. Taking this into consideration, it can be seen that the metal film of the present invention has sufficient adhesiveness in practice.

Thus, the metal pattern of the present invention enables the adhesiveness between the substrate and the metal film to be maintained, while suppressing the irregularities at the substrate side interface to a minimum level.

As the insulation property in a region in which no metal pattern is present, the surface resistivity is preferably 100 MΩ/square (10E+8 Ω/square) or more. By the hydrophobilizing treatment in the invention, 10E+11 Ω/square or more can be achieved.

It should be noted that the surface irregularities is a value measured by cutting a substrate, or the metal film after formation thereof, perpendicularly to the substrate surface, and observing the cut face using a SEM. More specifically, the Rz measured according to JIS B0601, namely "the difference between the average of the Z data from the maximum peak to the fifth highest peak, and the average of the Z data from the minimum valley to the fifth lowest valley", should be no more than 500 nm.

Moreover, the value of the adhesiveness between the substrate and the metal pattern, is a value obtained by bonding a copper plate (thickness: 0.1 mm) using an epoxy adhesive (ARALDITE, made by Ciba-Geigy) onto the metal pattern surface, drying at 140° C. for 4 hours, then conducting a 90 degree peel test according to JIS C6481, or conducting a 90 degree peel test based on JISC6481 by directly peeling off an end portion of the metal pattern itself.

In a common metal pattern, a metal pattern having excellent high frequency characteristics may be obtained by making the irregularities of the substrate surface, i.e., the irregularities of the interface with the metal pattern, 500 nm or less. However, in a conventional metal pattern, since the adhesiveness of the substrate and the metal pattern would fall if the irregularities of the substrate surface are reduced, roughening of the substrate surface by various surface roughening methods cannot be avoided. Consequently, a method of providing a metal pattern on such a roughened surface is performed, and therefore, the irregularities of the interface in a conventional metal film is generally 1,000 nm or more.

However, since the metal pattern obtained by the present invention is in a hybrid state, with the graft polymer directly chemically bonded to the substrate, even though the irregularities of the substrate surface is small, the irregularities at the interface of the metal pattern (inorganic component) and polymer layer (organic component) obtained are small, and superior adhesiveness may be maintained.

In the metal pattern of the present invention, a substrate with surface irregularities of no more than 500 nm is preferably selected, however, with regard to the surface irregularities, no more than 300 nm is more preferable, no more than 100 nm is even more preferable, and most preferable is no more than 50 nm. There are no particular limitations to the lower limit thereof, however, about 5 nm may be considered to be the lower limit from a practical standpoint of the ease of production, and the like. It should be noted that when using the metal pattern obtained by the present invention as metal wiring, the smaller the irregularities at the interface of the metal which forms the metal wiring and the organic material, the smaller the power loss during high frequency power transmission, and so a small irregularities of the surface are preferable.

As mentioned above, the value of the ten-point average roughness (Rz) is a value according to the method set out in JIS B0601, and the irregularities of the substrate surface is selected to be 500 nm or less, preferably 300 nm or less, even more preferably 100 nm or less, and most preferably 50 nm or less.

For such a smooth substrate, one which itself is smooth, such as a resin substrate, may be selected, or one with relatively large irregularities may be used by regulating the irregularity to be within the preferable range by providing an intermediate layer thereon.

The metal pattern of the present invention may, for example, be applied as a semiconductor chip, various kinds of printed wiring boards, FPC, COF, TAB, antennas, multilayer wiring substrates, mother boards and digital image display devices.

Printed Wiring Board

The printed wiring board of the invention can be produced by forming the metal pattern of the invention on a substrate to be an electroconductive layer (wiring).

The printed wiring board of the invention has a conductive layer that exhibits high adhesiveness between a substrate and that has fine and high density, and, at the same time, being excellent in the insulation property between the electroconductive layers (wirings). Therefore, in spite of fine wiring, no shirt circuit occurs to give a printed wiring board with a high reliability.

There are no particular limitations to be the substrates usable for the printed wiring board of the invention, and the examples of them include publicly known laminated boards used in usual wiring boards, for example, glass cloth-epoxy resin, paper-phenol resin, paper-epoxy resin, and glass cloth/glass paper-epoxy resin. In addition, a BT substrate formed by impregnating bismaleimide-triazine resin and, further, a polyimide film substrate using a polyimide film as a base material can also be used.

Moreover, the printed wiring board of the present invention can be formed into a multilayer printed wiring board through the buildup with an insulating material layer or an electric circuit substrate formed on an insulating material layer.

Hereinafter, exemplary embodiments of the invention will be described.

<1> A method for forming a metal pattern including steps of: (a1) a step of providing, on a substrate, a polymer layer that comprises a polymer containing a functional group that interacts with a metal ion or a metal salt, the polymer directly chemically bonding to the substrate; (a2) a step of applying a metal ion or a metal salt to the polymer layer; (a3) a step of reducing the metal ion or the metal salt to form a conductive layer having a surface resistivity of from 5 $\Omega$/square to 100 k$\Omega$/square; (a4) a step of forming a pattern-shaped resist layer on the conductive layer having a surface resistivity of from 5 $\Omega$/square to 100 k$\Omega$/square; (a5) a step of forming, in a region where the resist layer is not formed, a metal pattern by electroplating; (a6) a step of separating the resist layer; (a7) a step of removing the conductive layer formed in the step (a3) from the region that has been protected by the resist layer; and (a8) a step of performing a hydrophobilizing treatment to the polymer layer that has been provided in the step (a1) and exists in the region from which the conductive layer has been removed in the step (a7).

<2> The method for forming a metal pattern as described in the <1>, wherein the hydrophobilizing treatment in the step (a8) is a treatment of applying a hydrophobilizing agent to the polymer layer to react the hydrophobilizing agent and the polymer comprising the polymer layer.

<3> The method for forming a metal pattern as described in the <2>, wherein the hydrophobilizing agent is a metal that forms a hydrophobic salt with the polymer, or an organic reaction reagent that forms a hydrophobic compound as the result of the reaction with the polymer.

<4> The method for forming a metal pattern as described in the <3>, wherein the metal that forms a hydrophobic salt with the polymer is a metal selected from the group consisting of silver, iron, zinc, aluminum and calcium.

<5> The method for forming a metal pattern as described in the <3>, wherein the organic reaction reagent that reacts with the polymer to form a hydrophobic compound is an alkylating agent.

<6> The method for forming a metal pattern as describe in any of the <1> to <5>, wherein a metal included in the metal ion or metal salt comprises a metal selected from the group consisting of copper, silver, gold, nickel and Cr.

<7> The method for forming a metal pattern as described in any of the <1> to <6>, wherein the step (a3) is a step of forming a conductive layer having a surface resistivity of 5 $\Omega$/square to 100 k$\Omega$/square by applying an electroless plating liquid to the polymer layer having been applied the metal ion or metal salt, reducing the metal ion or metal salt to the metal and, at the same time, performing electroless plating while using the metal as an electroless plating catalyst.

<8> The method for forming a metal pattern as described in any of the <1> to <7>, wherein an electroplating bath used for the step (a5) includes an additive.

<9> The method for forming a metal pattern as described in any of the <1> to <8>, wherein the electroplating in the step (a5) is performed at a current density of from 0.1 mA/cm$^2$ to 3 mA/cm$^2$ until consumption of electricity reaches from $\frac{1}{10}$ to $\frac{1}{4}$ of the total consumption of the electricity from the commencement of electric current flow to the termination of electric current flow.

<10> A method for forming a metal pattern including steps of: (b1) a step of providing, on a substrate, a polymer layer that comprises a polymer containing a functional group that interacts with a metal colloid, the polymer directly chemically bonding to the substrate; (b2) a step of applying a metal colloid to the polymer layer to form a conductive layer having a surface resistivity of from 5 $\Omega$/square to 100 k$\Omega$/square; (b3) a step of forming a pattern-shaped resist layer on the conductive layer having a surface resistivity of from 5 $\Omega$/square to 100 k$\Omega$/square; (b4) a step of forming, in a region where the resist layer is not formed, a metal pattern by electroplating; (b5) a step of separating the resist layer; (b6) a step of removing the conductive layer formed in the step (b2) from the region that has been protected by the resist layer; and (b7) a step of performing a hydrophobilizing treatment to the polymer layer that has been provided in the step (b1) and exists in the region from which the conductive layer has been removed in the step (b6).

<11> The method for forming a metal pattern as described in the <10>, wherein the hydrophobilizing treatment in the step (b7) is a treatment of applying a hydrophobilizing agent to the polymer layer to react the hydrophobilizing agent and the polymer comprising the polymer layer.

<12> The method for forming a metal pattern as described in the <11>, wherein the hydrophobilizing agent is a metal that forms a hydrophobic salt with the polymer, or an organic reaction reagent that forms a hydrophobic compound as the result of the reaction with the polymer.

<13> The method for forming a metal pattern as described in <12>, wherein the metal that forms a hydrophobic salt with the polymer is a metal selected from the group consisting of silver, iron, zinc, aluminum and calcium.

<14> The method for forming a metal pattern as described in the <12>, wherein the organic reaction reagent that reacts with the polymer to form a hydrophobic compound is an alkylating agent.

<15> The method for forming a metal pattern as described in any of the <10> to <15>, wherein the step (b2) is a step of forming a conductive layer having a surface resistivity of 5 Ω/square to 100 kΩ/square by applying an electroless plating liquid to the polymer layer having been applied the metal colloid, performing electroless plating while using the metal colloid as an electroless plating catalyst.

<16> The method for forming a metal pattern as described in any of the <10> to <15>, wherein an electroplating bath used for the step (b4) includes an additive.

<17> The method for forming a metal pattern as described in any of the <10> to <16>, wherein the electroplating in the step (b4) is performed at a current density of from 0.1 mA/cm$^2$ to 3 mA/cm$^2$ until consumption of electricity reaches from 1/10 to 1/4 of the total consumption of the electricity from the commencement of electric current flow to the termination of electric current flow.

<18> A metal pattern obtained by the method for forming a metal pattern as described in any of the <1> to <17>.

<19> A printed wiring board provided with a metal pattern as described in the <18> as an electroconductive layer.

EXAMPLES

Hereinafter, the present invention will be explained in detail with reference to Examples, however, the present invention is not limited thereto.

<Exemplary Embodiment and Evaluation of Hydrophobilizing Treatment>

Regarding the hydrophobilizing treatment for the polymer layer, which is one of characteristics of the invention, the exemplary embodiment will be specifically described. Further, the improvement in the insulating property by the hydrophobilization of the polymer layer was evaluated by measuring the surface resistance of the polymer after the hydrophobilizing treatment.

Meanwhile, to the hydrophobilizing treatment in methods (1) and (2) for forming a metal pattern of the invention, the hydrophobilizing treatment as described here in detail is applied. As described above, the hydrophobilizing treatment in the present invention is performed, after the formation of a metal pattern, at the polymer layer that is present in a region in which no metal pattern is formed. But, hereinafter, the description and evaluation of the hydrophobilizing treatment are performed for an exemplary embodiment in which the formation of the metal pattern is omitted.

(Preparation of Substrate)

Onto the surface of a polyimide film (product name: Kapton, made by DuPont-Toray Co., Ltd.) as a base material, the photopolymerizable composition described below was coated using a rod bar No. 18, dried for 2 minutes at 80° C., and an intermediate layer of 6 µm in thickness was formed thereby.

Light-irradiation using a 400 W high pressure mercury vapor lamp (part number: UVL-400P, made by Riko Kagaku Sangyo Co., Ltd.) was performed for 10 minutes to the substrate provided with the above intermediate layer, and substrate A was prepared.

<Coating Liquid for Intermediate Layer>

| | |
|---|---|
| Allylmethacrylate/methacrylic acid copolymer (copolymerization molar ratio: 80/20, average molecular weight: 100,000) | 2 g |
| Ethyleneoxide-modified bisphenol A diacrylate (trade name: IR125, manufactured by Wako Pure Chemical Industries, Ltd.) | 4 g |
| 1-hydroxycyclohexyl phenyl ketone | 1.6 g |
| 1-methoxy-2-propanol | 16 g |

[Formation of Graft Polymer Layer]

Acrylic acid was coated to the surface of the produced substrate A using a rod bar #6, and a 15 µm thick PP film was laminated on the coated face.

Further irradiation was carried out from above with a UV light (400 W high pressure mercury vapor lamp: UVL-400P, made by Riko Kagaku Sangyo Co., Ltd., irradiation duration; 30 seconds). After light-irradiation, the mask and laminate film were removed and washed with water, and a graft material A grafted with polyacrylic acid was obtained.

Using the graft material A obtained as above, a hydrophobilizing treatment 1 and hydrophobilizing treatment 2 were performed, and an evaluation was carried out.

(Hydrophobilizing Treatment 1)

As an aqueous solution containing the hydrophobilizing agent, an aqueous 1% $Zn_2NO_3$ salt solution was used. In the aqueous solution, the graft material A was immersed at room temperature for 5 minutes, and then washed and dried to give a hydrophobilized sample (1-1).

In addition, by performing the same hydrophobilizing treatment as described above except for using an aqueous 1% $Al(NO_3)_3$ salt solution, or an aqueous 1% $CaCl_2$ solution in place of the aqueous 1% $Zn(NO_3)_2$ salt solution to give hydrophobilized samples (1-2) and (1-3).

Further, the same hydrophobilizing treatment as described above was performed except for using distilled water in place of the aqueous solution containing the hydrophobilizing agent to give a comparative sample (1-1).

For the obtained hydrophobilized samples (1-1)-(1-3), and the comparative sample (1-1), the surface resistance was measured with a resistivity meter (high resistance) Hiresta UP model MCP-HT450 manufactured by Dia Instruments Co., Ltd., under such environment as 25° C. and 50% RH by a measuring method according to JIS-C-2141. Results are shown in Table 1.

TABLE 1

| Sample No. | Aqueous solution containing hydrophobilizing agent | Surface resistance (Ω/square) |
|---|---|---|
| Comparative sample (1-1) | None (distilled water) | 1.0E+08 |
| Hydrophobilized sample (1-1) | Aqueous 1% $Al(NO_3)_3$ solution | 1.8E+12 |
| Hydrophobilized sample (1-2) | Aqueous 1% $Ca(NO_3)_2$ solution | 4.0E+12 |
| Hydrophobilized sample (1-3) | Aqueous 1% $Zn(NO_3)_2$ solution | 1.5E+13 |

(Hydrophobilizing Treatment 2)

An alkylating agent (1) was used as a treatment solution containing the hydrophobilizing agent. In the alkylating agent (1), the graft material A was immersed at room temperature for 5 minutes, and then heated at 100° C. for 30 minutes, washed with a methanol liquid, and dried to give a hydrophobilized sample (2-1).

In addition, the same hydrophobilizing treatments as described above were performed except for using an alkylating agent (2) or an alkylating agent (3) in place of the alkylating agent (1) to give hydrophobilized samples (2-2) and (2-3).

Further, the same hydrophobilizing treatment as described above was performed except for using methanol liquid in place of the treatment solution containing the hydrophobilizing agent to give a comparative sample (2-1).

For the obtained hydrophobilized samples (2-1)-(2-3), and the comparative sample (2-1), the surface resistance was measured with the resistivity meter (high resistance) Hiresta UP model MCP-HT450 manufactured by Dia Instruments Co., Ltd., under such environment as 25° C. and 50% RH. Results are shown in Table 2.

Details of the alkylating agents (1) to (3) are as follows.

Alkylating agent (1): $BF_3$/Methanol (14% Borontrifluorode; 86% Methanol)

Alkylating agent (2): N,N-Dimethylformamide dimethyl acetal

Alkylating agent (3): dimethyl sulfate

TABLE 2

| Sample No. | Treatment solution containing hydrophobilizing agent | Surface resistance (Ω/square) |
|---|---|---|
| Comparative sample (2-1) | None (MeOH liquid) | 1.0E+08 |
| Hydrophobilized sample (2-1) | Alkylating agent (1) | 3.2E+12 |
| Hydrophobilized sample (2-2) | Alkylating agent (2) | 2.7E+12 |
| Hydrophobilized sample (2-3) | Alkylating agent (3) | 5.3E+11 |

As shown in Tables 1 and 2, it was confirmed that the surface resistance of the graft material A that had been subjected to the hydrophobilizing treatment with the aqueous solution or treatment solution containing the hydrophobilizing agent (hydrophobilized sample) is remarkably improved as compared with that of the graft material A treated with distilled water or methanol liquid (comparative sample).

Example 1

Formation of Graft Polymer Layer

On the substrate A prepared in the same manner as in Example 1, a coating liquid of polymer P1 having the composition below was coated using a spin coater. The film thickness of the film obtained was 0.8 μm. The whole surface of the obtained film was exposed for 1 minute using a 400 W low-pressure mercury lamp. The film obtained film was then washed with water, and a graft material B in which a graft polymer layer was formed and entire surface of the layer was changed to hydrophilic surface.

<Composition of Coating Liquid>

| Hydrophilic polymer P1 (synthetic method is shown below) | 0.25 g |
|---|---|
| Water | 5 g |
| Acetonitrile | 3 g |

<Synthetic Method of Hydrophilic Polymer P1>

18 g of polyacrylic acid (average molecular weight; 25,000) was dissolved in 300 g of DMAc, and 0.41 g of hydroquinone, 19.4 g of 2-methacryloiloxyethyl isocyanate, and 0.25 g of dibutyltin dilaurate were added thereto, then the resultant was allowed to react at 65° C. for 4 hours. The acid value of the polymer obtained was 7.02 meq/g. The carboxyl group was neutralized in a 1 mol/L aqueous solution of sodium hydroxide, added to ethyl acetate to allow the polymer to precipitate, washed well, and a hydrophilic polymer was obtained.

[Formation of Metal Pattern]

The obtained graft material B was immersed in an aqueous 1 mass % silver nitrate (manufactured by Wako Pure Chemical Industries, Ltd.) solution for 10 minutes, and then washed with diluted water. Subsequently, it was subjected to a plating treatment in an electroless plating bath as described below. The surface resistance of this material as measured by a four-point type surface resistance meter was found to be 5 Ω/square.

<Ingredients of Electroless Plating Bath>

| Copper sulfate | 0.3 g |
|---|---|
| NaK tartrate | 1.7 g |
| Sodium hydroxide | 0.7 g |
| Formaldehyde | 0.2 g |
| Water | 48 g |

On the material on which the conductive layer was formed as described above, a dry film resist was laminated (120° C., line speed 1 min/m, 0.5 Pa). To the obtained film, patterns having a line width and space width L/S=5 μm/25 μm, L/S=10 μm/20 μm or 10 mm/10 mm were exposed with a UV exposing machine manufactured by MIKASA CO., LTD. After the exposure, the film was developed in a 1% $NaCO_3$ bath to form a resist pattern.

The material after the formation of the resist pattern was subjected to electroplating in an electroplating bath as described below at a current amount of 0.5 mA/cm² for 10 minutes, subsequently at a current amount of 30 mA/cm².

After the electroplating, the surface resistance of the obtained metal pattern as measured by a four-point type surface resistance meter was found to be 0.02 Ω/square.

<Composition of Electroplating Bath>

| Copper sulfate | 38 g |
|---|---|
| Sulfuric acid | 95 g |
| Hydrochloric acid | 1 mL |
| COPPER GLEAM ST901 (manufactured by Meltex Inc.) | 3 mL |
| Water | 500 g |

Subsequently, the resist was separated using a 1% NaOH bath at 50° C., then after separating the resist, treatment was carried out at 40° C. for 20 minutes with a liquid of 10 times diluted soft etching liquid produced by MELTEX Inc with and a conductive layer formed on the portions that had been covered with the resist.

Further, the material formed by removing the conductive layer in the portions that had been covered by the resist was subjected to the hydrophobilizing treatment in the same way as the <Hydrophobilizing Treatment 1> while using an aqueous 1% $CaCl_2$ solution as the solution containing the hydrophobilizing agent.

Example 2

The metal pattern of Example 2 was obtained in the same manner as in Example 1, except for using "an aqueous 1% $Zn(NO_3)_2$ solution" in place of "the aqueous 1% $CaCl_2$ solution" used as the aqueous solution containing the hydrophobilizing agent in Example 1.

Example 3

The metal pattern of Example 3 was obtained in the same manner as in Example 1, except for using the alkylating agent (2) as the treatment solution containing the hydrophobilizing agent in place of "the aqueous 1% $CaCl_2$ solution" used as the aqueous solution containing the hydrophobilizing agent in Example 1, and performing the hydrophobilizing treatment in the same way as the aforementioned <Hydrophobilizing Treatment 2>.

Comparative Example 1

The metal pattern of Comparative Example 1 was obtained in the same manner as in Example 1, except for using distilled water without using an aqueous solution containing the hydrophobilizing agent in Example 1.

[Evaluation]
1. Evaluation of Insulation Property Between Electroconductive Layers (Wirings)

For respective metal patterns of obtained Examples 1 to 3 and Comparative Example 1, the surface resistance (Ω/square) in regions in which no metal pattern was present was measured by a resistivity meter (high resistivity) Hiresta UP model MCP-HT450 manufactured by Dia Instruments Co., Ltd., under such environment as 25° C. and 50% RH. Further, after subjecting respective metal patterns of Examples 1 to 3 and Comparative Example 1 to a humidifying treatment at 80° C. and 100% RH for 24 hours, the surface resistance thereof was measured in the same way as described above under the environment of 25° C. and 50% RH. Results are shown in Table 3.

TABLE 3

| | Aqueous solution/ treatment solution containing hydrophobilizing agent | Surface resistance (Ω/square) 25° C. 50% RH | |
|---|---|---|---|
| | | Just after preparation | After 24 hours at 80° C. 100% RH |
| Example 1 | Aqueous 1% $Ca(NO_3)_2$ solution | 3.5E+12 | 2.6E+11 |
| Example 2 | Aqueous 1% $Zn(NO_3)_2$ solution | 1.3E+13 | 5.4E+11 |
| Example 3 | Alkylating agent (2) | 2.3E+12 | 7.7E+11 |
| Comp Ex 1 | None (distilled water) | 1.1E+08 | 9.5E+07 |

As shown in Table 3, it is evident that the metal patterns in Examples 1 to 3 had a significantly increased surface resistance in regions in which no metal pattern was present, as compared with the metal pattern in Comparative Example 1 that had not been subjected to the hydrophobilizing treatment. In addition, it is evident that the surface resistance of the metal patterns in Examples 1 to 3 was excellently maintained in regions in which no metal pattern was present even when subjected to a humidifying treatment under high temperature and humidity, and that the metal patterns exhibited excellent insulation reliability.

Example 4

Formation of Graft Polymer Layer

In the same manner as in Example 2, a film formed by coating the polymer P1 on the substrate A was prepared. The whole surface of the obtained film was exposed with a 400 W low-pressure mercury lamp for 1 minute. The film obtained after the exposure was washed with water, and a graft material C in which a graft polymer layer was formed and entire surface of the layer was changed to hydrophilic surface.

[Formation of Metal Pattern]

The obtained graft material C was immersed in an aqueous 5% by mass copper sulfate (manufactured by Wako Pure Chemical Industries, Ltd.) solution for 10 minutes, which was then washed with diluted water. Subsequently, the material was immersed in an aqueous 0.2M $NaBH_4$ solution for 20 minutes to reduce to metal copper, thereby forming the electroconductive layer. The surface resistance of the formed conductive layer as measured by a four-point type surface resistance meter was found to be 20 Ω/square.

[Step (a4)]

On the material on which the conductive layer was formed as described above, a dry film resist was laminated (120° C., line speed 1 min/m, 0.5 Pa). To the obtained film, patterns having a line width and space width L/S=5 μm/25 μm, L/S=10 μm/20 μm or 10 mm/10 mm were exposed with a laser exposure machine of 405 nm. After the exposure, the film was developed in a 1% $NaCO_3$ bath to give a resist pattern.

The material after forming the resist pattern was subjected to electroplating in the same electroplating bath as in Example 1 at a current amount of 0.5 mA/cm² for 10 minutes, subsequently at a current amount of 30 mA/cm². After the electroplating, the surface resistance of the obtained metal pattern as measured by a four-point type surface resistance meter was found to be 0.02 Ω/square.

Subsequently, the resist was separated using a 1% NaOH bath at 50° C., then after separating the resist, treatment was carried out at 40° C. for 20 minutes with a liquid of 10 times diluted soft etching liquid produced by MELTEX Inc with and a conductive layer formed on the portions that had been covered with the resist.

Further, the material formed by removing the electroconductive layer in the portions that were covered by the resist was subjected to the hydrophobilizing treatment in the same way as the <Hydrophobilizing Treatment 1> while using an aqueous 1% $CaCl_2$ solution as the solution containing the hydrophobilizing agent.

Example 5

The metal pattern of Example 5 was obtained in the same manner as in Example 4, except for using "an aqueous 1%

Zn(NO$_3$)$_2$ solution" in place of "the aqueous 1% CaCl$_2$ solution" used as the aqueous solution containing the hydrophobilizing agent in Example 4.

Example 6

The metal pattern of Example 6 was obtained in the same manner as in Example 4, except for using the alkylating agent (3) as the treatment solution containing the hydrophobilizing agent in place of "the aqueous 1% CaCl$_2$ solution" used as the aqueous solution containing the hydrophobilizing agent in Example 4, and performing the hydrophobilizing treatment in the same way as the <Hydrophobilizing Treatment 2>.

Comparative Example 2

The metal pattern of Comparative Example 2 was obtained in the same manner as in Example 1, except for using diluted water without using the aqueous solution containing the hydrophobilizing agent in Example 4.

[Evaluation]

For respective metal patterns obtained in Examples 4 to 6 and Comparative Example 2, the surface resistance (Ω/square) in regions in which no metal pattern was present was measured by a resistivity meter (high resistance) Hiresta UP model MCP-HT450 manufactured by Dia Instruments Co., Ltd., under such environment as 25° C. and 50% RH. Further, after subjecting respective metal patterns in Examples 4 to 6 and Comparative Example 2 to a humidifying treatment at 80° C. and 100% RH for 24 hours, the surface resistance thereof was measured in the same way as described above under the environment of 25° C. and 50% RH. Results are shown in Table 4.

TABLE 4

| | Aqueous solution/ treatment solution containing hydrophobilizing agent | Surface resistance (Ω/square) 25° C. 50% RH | |
|---|---|---|---|
| | | Just after preparation | After 24 hours at 80° C. 100% RH |
| Example 4 | Aqueous 1% Ca(NO$_3$)$_2$ solution | 4.0E+12 | 8.8E+11 |
| Example 5 | Aqueous 1% Zn(NO$_3$)$_2$ solution | 1.1E+13 | 4.2E+12 |
| Example 6 | Alkylating agent (3) | 4.5E+11 | 3.2E+11 |
| Comp Ex 2 | None (distilled water) | 1.2E+08 | 1.0E+08 |

As shown in Table 4, it is evident that the metal patterns in Examples 4 to 6 had a significantly increased surface resistance in regions in which no metal pattern was present, as compared with the metal pattern in Comparative Example 2 that had not been subjected to the hydrophobilizing treatment. In addition, it is evident that the surface resistance of the metal patterns in Examples 4 to 6 was excellently maintained in regions in which no metal pattern was present even when subjected to a humidifying treatment under high temperature and humidity, and that the metal patterns exhibited excellent insulation reliability.

The entire disclosure of Japanese Patent Application 2006-114849 is incorporated by reference herein. All publications, patent applications, and technical standards mentioned in this description are herein incorporated by reference to the same extent as if each individual publication, patent application, or technical standard was specifically and individually indicated to be incorporated by reference.

The invention claimed is:

1. A method for forming a metal pattern comprising:
(a1) a step of providing, on a substrate, a polymer layer that comprises a polymer containing a functional group that interacts with a metal ion or a metal salt, the polymer directly chemically bonding to the substrate;
(a2) a step of applying a metal ion or a metal salt to the polymer layer;
(a3) a step of reducing the metal ion or the metal salt to form a conductive layer having a surface resistivity of from 5 Ω/square to 100 kΩ/square;
(a4) a step of forming a pattern-shaped resist layer on the conductive layer having a surface resistivity of from 5 Ω/square to 100 kΩ/square;
(a5) a step of forming, in a region where the resist layer is not formed, a metal pattern by electroplating;
(a6) a step of separating the resist layer;
(a7) a step of removing the conductive layer formed in the step (a3) from a region that has been protected by the resist layer; and
(a8) a step of performing a hydrophobilizing treatment at the polymer layer that has been provided in the step (a1) and that is present in the region from which the conductive layer has been removed in the step (a7).

2. The method for forming a metal pattern according to claim 1, wherein the hydrophobilizing treatment in the step (a8) is a treatment of applying a hydrophobilizing agent to the polymer layer to react the hydrophobilizing agent and the polymer comprising the polymer layer.

3. The method for forming a metal pattern according to claim 2, wherein the hydrophobilizing agent is a metal that forms a hydrophobic salt with the polymer, or an organic reaction reagent that reacts with the polymer to form a hydrophobic compound.

4. The method for forming a metal pattern according to claim 3, wherein the metal that forms a hydrophobic salt with the polymer is a metal selected from the group consisting of silver, iron, zinc, aluminum and calcium.

5. The method for forming a metal pattern according to claim 3, wherein the organic reaction reagent that reacts with the polymer to form a hydrophobic compound is an alkylating agent.

6. The method for forming a metal pattern according to claim 1, wherein a metal included in the metal ion or metal salt comprises a metal selected from the group consisting of copper, silver, gold, nickel and Cr.

7. The method for forming a metal pattern according to claim 1, wherein the step (a3) is a step of forming a conductive layer having a surface resistivity of 5 Ω/square to 100 kΩ/square by applying an electroless plating liquid to the polymer layer to which the metal ion or metal salt has been applied, reducing the metal ion or metal salt to the metal and, at the same time, performing electroless plating while using the metal as an electroless plating catalyst.

8. The method for forming a metal pattern according to claim 1, wherein an electroplating bath used for the step (a5) includes an additive.

9. The method for forming a metal film according to claim 1, wherein the electroplating in the step (a5) is performed at a current density of from 0.1 mA/cm$^2$ to 3 mA/cm$^2$ until consumption of quantity of electricity reaches from 1/10 to 1/4 of the total consumption of quantity of electricity required from the commencement of electric current flow to the termination of electric current flow.

* * * * *